United States Patent
Fujii

(10) Patent No.: US 10,145,909 B2
(45) Date of Patent: Dec. 4, 2018

(54) MAGNETISM MEASURING DEVICE, GAS CELL, MANUFACTURING METHOD OF MAGNETISM MEASURING DEVICE, AND MANUFACTURING METHOD OF GAS CELL

(71) Applicant: SEIKO EPSON CORPORATION, Tokyo (JP)

(72) Inventor: Eiichi Fujii, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 443 days.

(21) Appl. No.: 14/933,798

(22) Filed: Nov. 5, 2015

(65) Prior Publication Data

US 2016/0139215 A1    May 19, 2016

(30) Foreign Application Priority Data

Nov. 17, 2014  (JP) ................................ 2014-232435
Nov. 17, 2014  (JP) ................................ 2014-232436

(51) Int. Cl.
  *G01R 33/26*  (2006.01)
  *F17C 3/00*  (2006.01)

(52) U.S. Cl.
  CPC .............. *G01R 33/26* (2013.01); *F17C 3/00* (2013.01)

(58) Field of Classification Search
  CPC .. G01R 33/032; G01R 33/26; G01R 33/0052; G01R 33/282; G01R 33/0322; H03L 7/26; G04F 5/145; G04F 5/14
  See application file for complete search history.

(56) References Cited

U.S. PATENT DOCUMENTS

| 2003/0052102 | A1 |  | 3/2003 | Amako et al. |
| 2003/0205564 | A1 |  | 11/2003 | Amako et al. |
| 2005/0241483 | A1 | * | 11/2005 | Okada .................... B01D 53/02 96/134 |
| 2010/0156547 | A1 | * | 6/2010 | McGuyer ............... G04F 5/145 331/94.1 |
| 2011/0232782 | A1 | * | 9/2011 | Borwick, III .......... G04F 5/145 137/551 |
| 2012/0206135 | A1 | * | 8/2012 | Nagasaka ............ G01R 33/032 324/244.1 |

(Continued)

FOREIGN PATENT DOCUMENTS

| JP | 2003-305585 A | 10/2003 |
| JP | 2012-183290 A | 9/2012 |
| JP | 2013-065819 A | 4/2013 |

OTHER PUBLICATIONS

D. Budker et al. "Resonant nonlinear magneto-optical effects in atoms," Reviews of Modern Physics, vol. 74, pp. 1153-1201, Oct. 2002.

*Primary Examiner* — Ruifeng Pu
(74) *Attorney, Agent, or Firm* — Oliff PLC

(57) ABSTRACT

A magnetism measuring device includes: a gas cell which includes a cell portion that has a main chamber, a reservoir, a communication hole which allows the main chamber and the reservoir to communicate with each other, and an opening provided in the reservoir, a sealing portion which seals the opening, an ampoule disposed in the reservoir, and an alkali metal gas which fills the main chamber and the reservoir. The ampoule is disposed at a predetermined position in the reservoir, and the opening is provided at a position that is distant from the predetermined position.

19 Claims, 17 Drawing Sheets

(56) References Cited

U.S. PATENT DOCUMENTS

| | | | |
|---|---|---|---|
| 2013/0047417 A1* | 2/2013 | Nagasaka | G01R 33/0076 29/592.1 |
| 2013/0230673 A1* | 9/2013 | Nagasaka | A61B 5/04005 428/34.1 |
| 2013/0300510 A1* | 11/2013 | Tamura | H03L 1/02 331/69 |
| 2013/0341745 A1* | 12/2013 | Suzuki | G01R 33/032 257/427 |
| 2014/0232478 A1* | 8/2014 | Maki | H03B 17/00 331/94.1 |
| 2014/0232479 A1* | 8/2014 | Maki | H01S 1/06 331/94.1 |
| 2015/0027908 A1* | 1/2015 | Parsa | F17C 3/00 206/0.7 |
| 2015/0061785 A1* | 3/2015 | Ishihara | H03L 7/26 331/94.1 |
| 2015/0084707 A1* | 3/2015 | Maki | H03L 7/26 331/94.1 |
| 2015/0091662 A1* | 4/2015 | Yoshida | G04F 5/145 331/94.1 |
| 2015/0102863 A1* | 4/2015 | Hashi | H03L 7/26 331/94.1 |
| 2015/0171325 A1* | 6/2015 | Tanaka | H01L 49/006 331/94.1 |
| 2015/0180487 A1* | 6/2015 | Yoshida | H03L 7/26 331/94.1 |
| 2015/0180490 A1* | 6/2015 | Chindo | H03L 7/26 331/94.1 |
| 2015/0180492 A1* | 6/2015 | Yoshida | H03L 7/26 331/94.1 |
| 2015/0214895 A1* | 7/2015 | Hashi | G04F 5/14 331/94.1 |
| 2015/0244382 A1* | 8/2015 | Ishihara | H03L 7/26 331/94.1 |
| 2015/0270843 A1* | 9/2015 | Nakajima | H03L 7/26 331/94.1 |
| 2015/0270844 A1* | 9/2015 | Maki | H03L 7/26 331/94.1 |
| 2015/0349791 A1* | 12/2015 | Nakajima | H03L 7/26 331/94.1 |
| 2015/0369427 A1* | 12/2015 | Nagasaka | F17C 13/00 206/0.6 |
| 2016/0001942 A1* | 1/2016 | Fujii | G01R 33/26 220/359.1 |
| 2016/0023401 A1* | 1/2016 | Fujii | G01R 33/0052 156/272.8 |
| 2016/0025822 A1* | 1/2016 | Takahashi | G01R 33/032 324/244.1 |
| 2016/0097824 A1* | 4/2016 | Fujii | G01R 33/032 324/244.1 |
| 2016/0109538 A1* | 4/2016 | Fujii | G01R 33/26 324/305 |
| 2016/0126965 A1* | 5/2016 | Hashi | G04F 5/145 331/94.1 |
| 2016/0131723 A1* | 5/2016 | Nagasaka | G01R 33/26 324/244.1 |
| 2016/0139215 A1* | 5/2016 | Fujii | G01R 33/26 324/305 |
| 2016/0169989 A1* | 6/2016 | Suzuki | G01R 33/26 324/305 |
| 2016/0216712 A1* | 7/2016 | Baumgartner | A61L 2/22 |
| 2016/0313418 A1* | 10/2016 | Fujii | G01R 33/26 |
| 2016/0352345 A1* | 12/2016 | Hashi | H03L 7/26 |
| 2016/0377469 A1* | 12/2016 | Teli | G01F 3/30 73/234 |
| 2017/0056532 A1* | 3/2017 | Freeman | A61K 49/18 |
| 2017/0097279 A1* | 4/2017 | Maki | G01M 5/0066 |
| 2017/0099060 A1* | 4/2017 | Chindo | H01S 1/00 |
| 2017/0141783 A1* | 5/2017 | Tanaka | H03L 7/26 |
| 2017/0199251 A1* | 7/2017 | Fujii | G01R 33/032 |
| 2017/0360322 A1* | 12/2017 | Ueno | A61B 5/0042 |
| 2018/0003778 A1* | 1/2018 | Miyazawa | G01R 33/0052 |

* cited by examiner

MAGNETISM MEASURING DEVICE, GAS CELL, MANUFACTURING METHOD OF MAGNETISM MEASURING DEVICE, AND MANUFACTURING METHOD OF GAS CELL

BACKGROUND

1. Technical Field

The present invention relates to a magnetism measuring device, a gas cell, a manufacturing method of a magnetism measuring device, and a manufacturing method of a gas cell.

2. Related Art

An optical pumping type magnetism measuring device which irradiates a gas cell, in which an alkali metal gas is sealed, with linearly polarized light and measures a magnetic field according to a rotation angle of a polarization plane is known. JP-A-2012-183290 discloses a magnetism measuring device provided with a gas cell, in which an ampoule containing an alkali metal sealed therein is accommodated in a reservoir (ampoule accommodation chamber), the ampoule is irradiated with laser light so as to form a through-hole in a glass tube of the ampoule, and the alkali metal in the ampoule is vaporized to fill a main chamber with the vapor (gas) from the reservoir via a communication hole.

However, when the ampoule is irradiated with the laser light, if the ampoule is not stable in the reservoir and the position of each individual ampoule varies, the irradiation position of the laser light with respect to the ampoule may be shifted. In addition, the ampoule may be moved by an impact of the laser light irradiation due to the unstable ampoule. In this case, processing performed in a depth direction using the laser light irradiation does not progress and the glass tube of the ampoule cannot be penetrated, which causes a decrease in manufacturing yield and an increase in the number of manufacturing processes due to the repeated processing. In addition, for example, in a case where the ampoule is inserted through an opening provided in the side surface of the reservoir and is accommodated in the reservoir and the opening is blocked and sealed by a sealing portion, during handling from the process of accommodating the ampoule to the sealing process or during sealing by the sealing portion, the ampoule may come out of the reservoir through the opening. Even in this case, a decrease in manufacturing yield and an increase in the number of manufacturing processes are incurred. Therefore, a gas cell and a magnetism measuring device capable of holding the ampoule accommodated in the reservoir in a stable state and reliably forming a through-hole, and a manufacturing method thereof are required.

In addition, in the process of forming the through-hole, there may be a case where a process of irradiating a single spot with the laser light and forming a single through-hole is insufficient for processing performed in a depth direction, and thus the air-tightness of the ampoule is not broken. Otherwise, although the through-hole is formed, there may be a case where the amount of alkali metal vaporized in the ampoule is low and a long time is needed to fill the main chamber with the alkali metal gas. However, when the process of irradiating a single spot with the laser light is repeated several times in order to reliably form the through-hole and fill the main chamber with the alkali metal gas within a short time, there is a problem in that an increase in the number of manufacturing processes is incurred.

SUMMARY

An advantage of some aspects of the invention is to solve at least apart of the problems described above, and the invention can be implemented as the following forms or application examples.

APPLICATION EXAMPLE 1

A magnetism measuring device according to this application example is a magnetism measuring device for measuring a magnetic field, and including: a gas cell which includes a cell portion which has a first chamber, a second chamber, a communication hole which allows the first chamber and the second chamber to communicate with each other, and an opening provided in the second chamber, a sealing portion which seals the opening, an ampoule disposed in the second chamber, and an alkali metal gas which fills the first chamber and the second chamber, in which the ampoule is disposed at a predetermined position in the second chamber, and the opening is provided at a position that is distant from the predetermined position.

According to the configuration of this application example, in the gas cell of the magnetism measuring device, since the ampoule is disposed at the predetermined position in the second chamber, the ampoule is held in the second chamber in a stable state. Therefore, when the through-hole is formed by irradiating the ampoule with the laser light, variations in the irradiation position of the laser light with respect to the ampoule are suppressed, movement of the ampoule due to an impact caused by the laser light irradiation is also suppressed, and thus the through-hole can be reliably formed in the ampoule. In addition, since the opening is provided at the position that is distant from the predetermined position in the second chamber, during handling performed until the opening is sealed with the sealing portion or during sealing of the opening with the sealing portion, the discharge of the ampoule from the second chamber through the opening can be suppressed. Accordingly, a gas cell and a magnetism measuring device capable of enhancing productivity by suppressing a decrease in the manufacturing yield of the magnetism measuring device and an increase in the number of manufacturing processes can be provided.

APPLICATION EXAMPLE 2

In the magnetism measuring device according to the application example, it is preferable that an inclined surface provided on a bottom portion side of the second chamber is further included, the predetermined position is the lowermost position in the inclined surface, and the opening is provided at a position higher than the inclined surface.

According to the configuration of this application example, since the ampoule is disposed at the lowermost position in the inclined surface on the bottom portion side of the second chamber, the ampoule can be held in a stable state in the second chamber. In addition, when the ampoule is inserted through the opening that is provided at a higher position than the inclined surface in order to dispose the ampoule in the second chamber, the ampoule falls on the inclined surface and moves toward the lower side along the inclined surface. Therefore, the ampoule can be easily disposed at the predetermined position. In addition, since the opening is provided at a higher position than the inclined surface, the discharge of the ampoule from the second chamber through the opening can be effectively suppressed.

APPLICATION EXAMPLE 3

In the magnetism measuring device according to the application example, it is preferable that the first chamber and the second chamber are arranged along a first direction, the inclined surface is inclined along a second direction that intersects the first direction, the ampoule has a longitudinal direction, and the longitudinal direction is disposed to follow the first direction, and the opening is provided at a position that is distant from the predetermined position in the second direction.

According to the configuration of this application example, since the inclined surface is inclined along the second direction and the ampoule is disposed so that the longitudinal direction thereof follows the first direction that intersects the inclination direction of the inclined surface, the ampoule can be held in a stable state in the second chamber. In addition, since the opening is provided at the position that is distant from the predetermined position in the second direction that follows the inclination direction of the inclined surface, the ampoule can be inserted into the second chamber through the opening so as to allow the longitudinal direction of the ampoule to follow the first direction, and the discharge of the ampoule from the second chamber through the opening can be suppressed.

APPLICATION EXAMPLE 4

In the magnetism measuring device according to the application example, it is preferable that the first chamber and the second chamber are arranged along a first direction, the inclined surface is inclined along the first direction, the ampoule has a longitudinal direction, and the longitudinal direction is disposed to follow a second direction that intersects the first direction, and the opening is provided at a position that is distant from the predetermined position in the first direction.

According to the configuration of this application example, since the inclined surface is inclined along the first direction and the longitudinal direction of the ampoule is disposed to follow the second direction that intersects the inclination direction of the inclined surface, the ampoule can be held in a stable state in the second chamber. In addition, since the opening is provided at the position that is distant from the predetermined position in the first direction which follows the inclination direction of the inclined surface, the ampoule can be inserted into the second chamber through the opening so as to allow the longitudinal direction of the ampoule to follow the second direction, and the discharge of the ampoule from the second chamber through the opening can be suppressed.

APPLICATION EXAMPLE 5

In the magnetism measuring device according to the application example, it is preferable that the second chamber includes a convex portion formed by the two inclined surfaces which are inclined toward opposite sides to each other in the same direction and thus intersect each other, and the opening is disposed between a position at which the inclined surfaces intersect each other and the predetermined position in the direction in which the two inclined surfaces are inclined.

According to the configuration of this application example, since the convex portion is formed by the two inclined surfaces which are inclined toward opposite sides to each other and thus intersect each other, the bottom portion side of the second chamber has a mountain shape with a position at which the two inclined surfaces intersect each other in a cross-sectional view as the apex. The lowermost position in the inclined surfaces having the mountain shape is the predetermined position at which the ampoule is disposed, and thus the ampoule can be held in a stable state in the second chamber. In addition, since the opening is disposed between the predetermined position and the position of the apex of the mountain-shaped convex portion in the direction in which the inclined surfaces are inclined, that is, at a position higher than the predetermined position which is lowest in height in the inclined surface, the ampoule is allowed to move along the inclined surface by being inserted through the opening and thus can be easily disposed at the predetermined position.

APPLICATION EXAMPLE 6

In the magnetism measuring device according to the application example, it is preferable that the second chamber includes a concave portion formed by the two inclined surfaces which are inclined toward opposite sides to each other in the same direction and thus intersect each other, and the opening is disposed at a position that is distant from a position at which the inclined surfaces intersect each other in the direction in which the two inclined surfaces are inclined.

According to the configuration of this application example, since the concave portion is formed by the two inclined surfaces which are inclined toward opposite sides to each other and thus intersect each other, the bottom portion side of the second chamber has a valley shape with a position at which the two inclined surfaces intersect each other in a cross-sectional view as the valley bottom. The position of the valley bottom which is lowest in height in the inclined surface having the valley shape is the predetermined position at which the ampoule is disposed, and thus the ampoule can be held in a stable state in the second chamber. In addition, since the opening is disposed at the position that is distant from the position of the valley bottom of the valley-shaped concave portion in the direction in which the inclined surfaces are inclined, that is, at a position higher than the predetermined position which is lowest in height in the inclined surface, the ampoule is allowed to move along the inclined surface by being inserted through the opening and thus can be easily disposed at the predetermined position.

APPLICATION EXAMPLE 7

In the magnetism measuring device according to the application example, it is preferable that the communication hole is provided at a position that is distant from the predetermined position.

According to the configuration of this application example, the communication hole which allows the second chamber in which the ampoule is disposed and the first chamber to communicate with each other is provided at the position that is distant from the position at which the ampoule is disposed. Therefore, when the through-hole is formed by irradiating the ampoule with the laser light, while suppressing the infiltration of fragments of the ampoule or the alkali metal solid into the first chamber, the first chamber can be filled with the alkali metal gas.

APPLICATION EXAMPLE 8

In the magnetism measuring device according to the application example, it is preferable that the communication hole is provided at a position higher than the predetermined position.

According to the configuration of this application example, the communication hole which allows the second chamber in which the ampoule is disposed and the first chamber to communicate with each other is provided at the position higher than the position at which the ampoule is disposed. Therefore, when the through-hole is formed by irradiating the ampoule with the laser light, while effectively suppressing the infiltration of fragments of the ampoule or the alkali metal solid into the first chamber, the first chamber can be filled with the alkali metal gas.

APPLICATION EXAMPLE 9

A magnetism measuring device according to this application example is a magnetism measuring device for measuring a magnetic field, and including: a gas cell which includes a cell portion which has a first chamber, a second chamber, and a communication hole which allows the first chamber and the second chamber to communicate with each other, an ampoule disposed in the second chamber, and an alkali metal gas which fills the first chamber and the second chamber, in which the second chamber is provided with a predetermined position in which the ampoule is settled, and a plurality of through-holes are formed in the ampoule.

According to the configuration of this application example, since the plurality of through-holes are formed in the ampoule, compared to a case of forming a through-hole only at a single spot, the probability of breaking the airtightness of the ampoule is increased, and an area from which the alkali metal material provided inside is exposed is enlarged. Therefore, the first chamber can be filled with the alkali metal gas from the second chamber through the communication hole within a short time. In addition, since the through-hole can be formed by emitting the laser light in a state where the ampoule is disposed at the predetermined position in which the ampoule is settled, compared to a case where a position in which the ampoule is settled is not provided, the alignment of the position irradiated with the laser light can be performed on the ampoule more accurately. Accordingly, a magnetism measuring device capable of enhancing productivity can be provided.

APPLICATION EXAMPLE 10

A gas cell according to this application example includes: a cell portion which includes a first chamber, a second chamber, a communication hole which allows the first chamber and the second chamber to communicate with each other, and an opening provided in the second chamber; a sealing portion which seals the opening; an ampoule disposed in the second chamber; and an alkali metal gas which fills the first chamber and the second chamber, in which the ampoule is disposed at a predetermined position in the second chamber, and the opening is provided at a position that is distant from the predetermined position.

According to the configuration of this application example, in the gas cell, since the ampoule is disposed at the predetermined position in the second chamber, the ampoule is held in the second chamber in a stable state. Therefore, when a through-hole is formed by irradiating the ampoule with laser light, variations in the irradiation position of the laser light with respect to the ampoule are suppressed, movement of the ampoule due to an impact caused by the laser light irradiation is also suppressed, and thus the through-hole can be stably and reliably formed in the ampoule. In addition, since the opening is provided at the position that is distant from the predetermined position in the second chamber, during handling performed until the opening is sealed with the sealing portion or during sealing of the opening with the sealing portion, the discharge of the ampoule from the second chamber through the opening can be suppressed. Accordingly, a gas cell capable of enhancing productivity can be provided.

APPLICATION EXAMPLE 11

A manufacturing method of a magnetism measuring device according to this application example includes: disposing an ampoule filled with an alkali metal material by inserting the ampoule through an opening in a second chamber of a cell portion which includes a first chamber, the second chamber, a communication hole which allows the first chamber and the second chamber to communicate with each other, and the opening provided in the second chamber; sealing the opening with a sealing portion; and forming a through-hole in the ampoule by irradiating the ampoule with laser light, in which, in the disposing of the ampoule, the ampoule is disposed at a predetermined position in the second chamber, and the opening is provided at a position that is distant from the predetermined position.

According to the manufacturing method of this application example, in the disposing of the ampoule, since the ampoule is disposed at the predetermined position in the second chamber, the ampoule is held in the second chamber in a stable state. Therefore, in the forming of the through-hole by irradiating the ampoule with the laser light, variations in the irradiation position of the laser light with respect to the ampoule are suppressed, movement of the ampoule due to an impact caused by the laser light irradiation is also suppressed, and thus the through-hole can be stably and reliably formed in the ampoule. In addition, since the opening is provided at the position that is distant from the predetermined position in the second chamber, during handling performed until the sealing of the opening with the sealing portion or during the sealing of the opening with the sealing portion, the discharge of the ampoule from the second chamber through the opening can be suppressed. Accordingly, the productivity of the magnetism measuring device can be enhanced.

APPLICATION EXAMPLE 12

A manufacturing method of a magnetism measuring device for measuring a magnetic field according to this application example includes: disposing an ampoule filled with an alkali metal material in a second chamber of a cell portion which includes a first chamber, the second chamber, and a communication hole which allows the first chamber and the second chamber to communicate with each other, and sealing the first chamber, the second chamber, and the communication hole; and forming a through-hole in the ampoule by irradiating the ampoule with laser light, in which, the second chamber is provided with a predetermined position in which the ampoule is settled, and in the forming of the through-hole, a plurality of spots of the ampoule are irradiated with the laser light with respect to the predetermined position.

According to the manufacturing method of this application example, since a plurality of spots of the ampoule disposed in the second chamber are irradiated with the laser light in the forming of the through-hole, a plurality of through-holes can be formed in the ampoule in parallel. Therefore, compared to a case of irradiating only a single spot with the laser light, the probability of breaking the air-tightness of the ampoule and forming the through-hole is increased, and an area from which the alkali metal material provided inside is exposed is enlarged. Therefore, the first chamber can be filled with the alkali metal gas from the second chamber through the communication hole within a short time. In addition, compared to a case of repeating the irradiation of only a single spot with the laser light and forming a plurality of through-holes, the number of manufacturing processes can be reduced. In addition, since the laser light is emitted with respect to the predetermined position in a state where the ampoule is disposed in the predetermined position in which the ampoule is settled, compared to a case where a position in which the ampoule is settled is not provided, the alignment of the position irradiated with the laser light can be performed on the ampoule more accurately. Accordingly, the number of manufacturing processes of the magnetism measuring device is reduced, thereby enhancing productivity.

APPLICATION EXAMPLE 13

In the manufacturing method of the magnetism measuring device according to the application example, it is preferable that the predetermined position is provided along a first direction, the ampoule has a longitudinal direction and is disposed at the predetermined direction so that the longitudinal direction follows the first direction, and in the forming of the through-hole, the plurality of spots are irradiated with the laser light along the first direction.

According to the manufacturing method of this application example, since the ampoule is disposed at the predetermined direction so as to allow the longitudinal direction thereof to follow the first direction and a plurality of spots along the longitudinal direction of the ampoule are irradiated with the laser light, a plurality of through-holes can be easily formed. In addition, each of the plurality of spots is easily aligned with the center of the width in the longitudinal direction of the ampoule, and thus the air-tightness can be more reliably broken in each of the plurality of spots.

APPLICATION EXAMPLE 14

In the manufacturing method of the magnetism measuring device according to the application example, it is preferable that, in the forming of the through-hole, the laser light is emitted along the first direction while performing scanning.

According to the manufacturing method of this application example, since the laser light is emitted along the first direction while performing scanning, the through-holes can be formed at the plurality of spots along the longitudinal direction of the ampoule in parallel.

APPLICATION EXAMPLE 15

In the manufacturing method of the magnetism measuring device according to the application example, it is preferable that, in the forming of the through-hole, the laser light is allowed to perform scanning by using a galvanometer scanner.

According to the manufacturing method of this application example, the laser light can be allowed to perform scanning along the first direction by using a galvanometer scanner.

APPLICATION EXAMPLE 16

In the manufacturing method of the magnetism measuring device according to the application example, it is preferable that, in the forming of the through-hole, the laser light is emitted in a state of being divided along the first direction.

According to the manufacturing method of this application example, since the laser light is emitted in a state of being divided along the first direction, the through-holes can be formed at the plurality of spots along the longitudinal direction of the ampoule in parallel.

APPLICATION EXAMPLE 17

In the manufacturing method of the magnetism measuring device according to the application example, it is preferable that, in the forming of the through-hole, the laser light is divided by using a diffraction grating.

According to the manufacturing method of this application example, the laser light can be divided along the first direction by using the diffraction grating.

APPLICATION EXAMPLE 18

In the manufacturing method of the magnetism measuring device according to the application example, it is preferable that, in the through-hole forming process, some of the plurality of spots are repeatedly irradiated with the laser light.

According to the manufacturing method of this application example, since some of the plurality of spots are repeatedly irradiated with the laser light, larger through-holes can be formed in the some of the spots. Therefore, the first chamber can be filled with the alkali metal gas within a shorter time.

APPLICATION EXAMPLE 19

A manufacturing method of a gas cell according to this application example includes: disposing an ampoule filled with an alkali metal material by inserting the ampoule through an opening in a second chamber of a cell portion which includes a first chamber, the second chamber, a communication hole which allows the first chamber and the second chamber to communicate with each other, and the opening provided in the second chamber; sealing the opening with a sealing portion; and forming a through-hole in the ampoule by irradiating the ampoule with laser light, in which, in the disposing of the ampoule, the ampoule is disposed at a predetermined position in the second chamber, and the opening is provided at a position that is distant from the predetermined position.

According to the manufacturing method of this application example, in the disposing of the ampoule, since the ampoule is disposed at the predetermined position in the second chamber, the ampoule is held in the second chamber in a stable state. Therefore, in the forming of the through-hole by irradiating the ampoule with the laser light, variations in the irradiation position of the laser light with respect to the ampoule are suppressed, movement of the ampoule due to an impact caused by the laser light irradiation is also suppressed, and thus the through-hole can be stably and reliably formed in the ampoule. In addition, since the opening is provided at the position that is distant from the predetermined position in the second chamber, during handling performed until the sealing of the opening with the sealing portion or during the sealing of the opening with the sealing portion, the discharge of the ampoule from the second chamber through the opening can be suppressed. Accordingly, the productivity of the gas cell can be enhanced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments which embody the invention will be described with reference to the drawings. The drawings that are used are appropriately enlarged, reduced, or exaggerated to allow described parts to be recognizable. In addition, there may be a case where the illustration of constituent elements which are not necessary for description is omitted.

First Embodiment

Configuration of Magnetism Measuring Device

Figure 1:
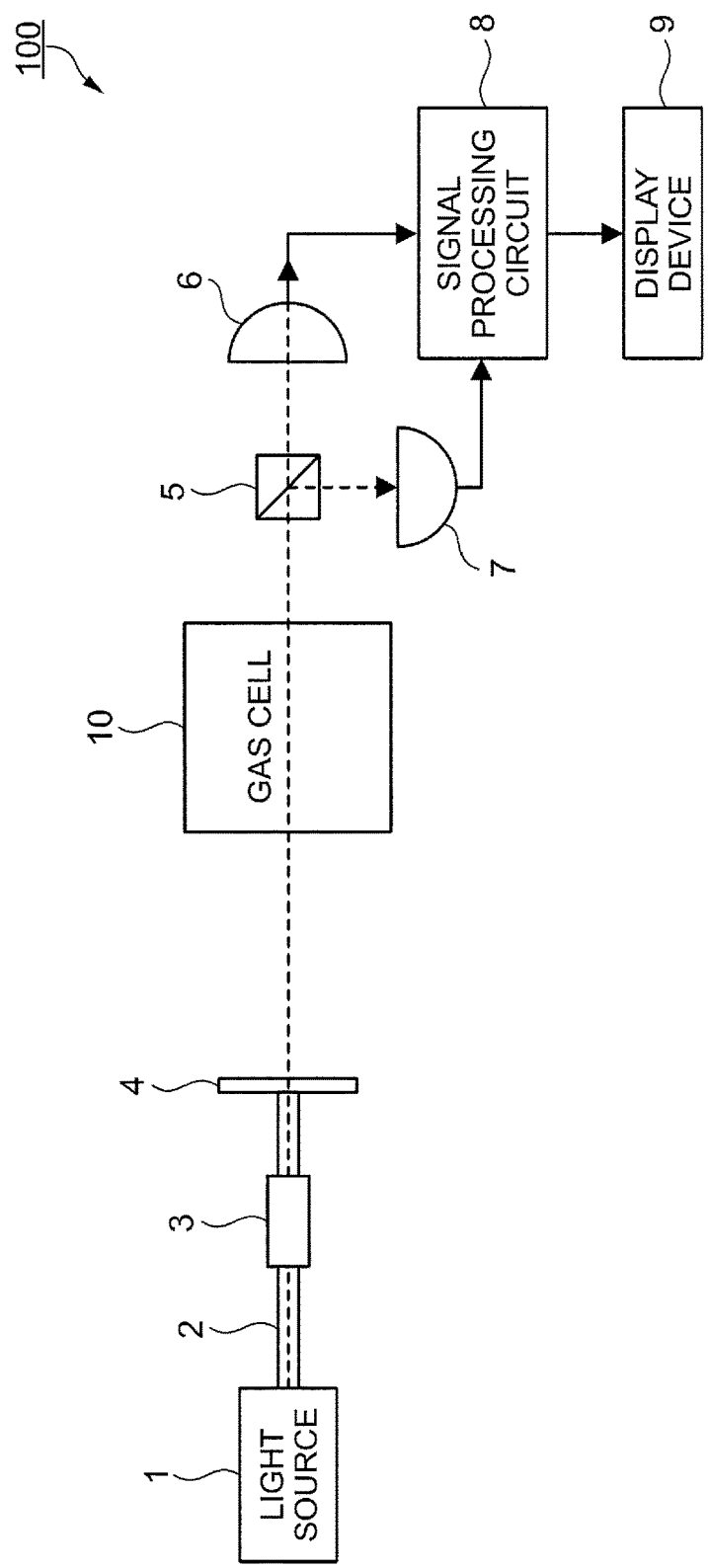
FIG. 1 is a block diagram illustrating the configuration of a magnetism measuring device according to an embodiment.

The configuration of a magnetism measuring device according to a first embodiment will be described with reference to FIG. 1. FIG. 1 is a block diagram illustrating the configuration of the magnetism measuring device according to this embodiment. A magnetism measuring device 100 according to this embodiment is a magnetism measuring device which uses nonlinear magneto-optical rotation (NMOR). The magnetism measuring device 100 is used in, for example, a living body state measuring device (magnetocardiography, magnetoencephalography, or the like) which measures a minute magnetic field generated from a living body such as a magnetic field from the heart (cardiac magnetism) or a magnetic field from the brain (cerebral magnetism). The magnetism measuring device 100 may also be used in a metal detector or the like.

As illustrated in FIG. 1, the magnetism measuring device 100 includes a light source 1, an optical fiber 2, a connector 3, a polarizing plate 4, a gas cell 10, a polarization splitter 5, a photodetector (PD) 6, a photodetector 7, a signal processing circuit 8, and a display device 9. An alkali metal gas (alkali metal atoms in a gas state) is sealed in the gas cell 10. As the alkali metal, for example, cesium (Cs), rubidium (Rb), potassium (K), or sodium (Na) may be used. In the following description, a case where cesium is used as the alkali metal is exemplified.

The light source 1 is a device which outputs a laser beam having a wavelength corresponding to the cesium absorption lines (for example, 894 nm corresponding to the D1 line), for example, a tunable laser. The laser beam output from the light source 1 is so-called continuous wave (CW) light having a continuously constant light intensity.

The polarizing plate 4 is an element which polarizes the laser beam in a specific direction into linearly polarized light. The optical fiber 2 is a member which guides the laser beam output from the light source 1 to the gas cell 10 side. As the optical fiber 2, for example, a single-mode optical fiber which propagates only a basic mode is used. The connector 3 is a member for connecting the optical fiber 2 to the polarizing plate 4. The connector 3 connects the optical fiber 2 to the polarizing plate 4 in a screw type.

Figure 2A:
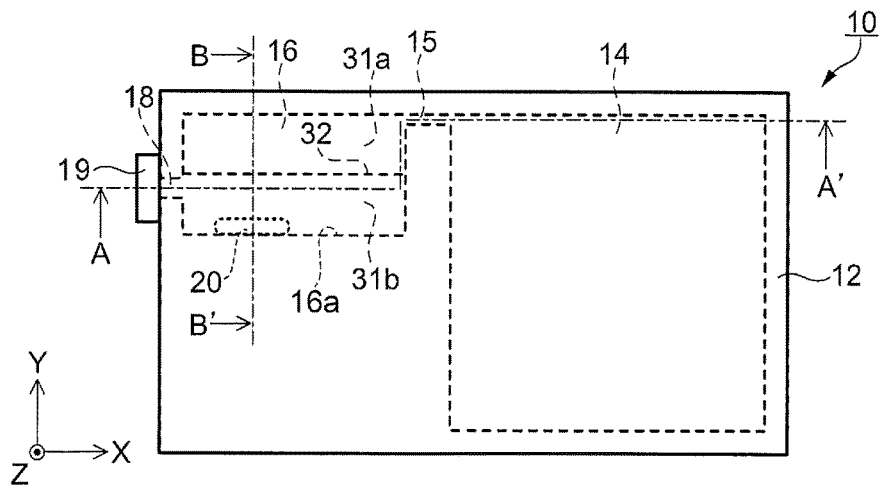
FIG. 2A is a schematic view illustrating the configuration of a gas cell according to a first embodiment.
Figure 2B:
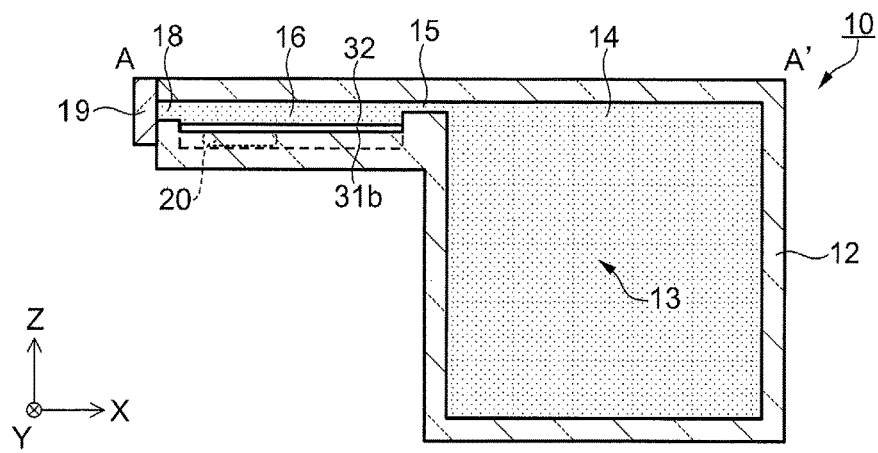
FIG. 2B is a schematic view illustrating the configuration of the gas cell according to the first embodiment.

The gas cell 10 is a box (cell) having a void therein, and the vapor of the alkali metal (an alkali metal gas 13 illustrated in FIG. 2B) is sealed in the void (a main chamber 14 illustrated in FIG. 2B). The configuration of the gas cell 10 will be described later.

The polarization splitter 5 is an element which splits the incident laser beam into beams having two polarization components that are perpendicular to each other. The polarization splitter 5 is, for example, a Wollaston prism is or a polarizing beam splitter. The photodetector 6 and the photodetector 7 are detectors having sensitivity to the wavelength of the laser beam, and output current corresponding to the light intensity of the incident light to the signal processing circuit 8. If the photodetector 6 and the photodetector 7 generate magnetic fields, the measurement may be affected. Therefore, it is preferable that the photodetector 6 and the photodetector 7 are formed of a non-magnetic material. The photodetector 6 and the photodetector 7 are disposed on the same side as that of the polarization splitter 5 (downstream side) when viewed from the gas cell 10.

The arrangement of the parts in the magnetism measuring device 100 will be described along the path of the laser beam. At the uppermost position in the path of the laser beam, the light source 1 is positioned. From the upstream side therebelow, the optical fiber 2, the connector 3, the polarizing plate 4, the gas cell 10, the polarization splitter 5, and the photodetectors 6 and 7 are arranged in this order.

The operation of each part in the magnetism measuring device 100 will be described along the progress of the laser beam. The laser beam output from the light source 1 is guided to the optical fiber 2 and reaches the polarizing plate 4. The laser beam that reaches the polarizing plate 4 becomes linearly polarized light having higher polarization degree. The laser beam that passes through the gas cell 10 allows the alkali metal atoms sealed in the gas cell 10 to excite (optical pumping). At this time, the laser beam undergoes a polarization plane rotation action according to the intensity of a magnetic field such that the polarization plane is rotated. The laser beam that has passed through the gas cell 10 is split into beams having two polarization components by the polarization splitter 5. The light intensities of the beams having the two polarization components are measured by the photodetectors 6 and 7 (probing).

The signal processing circuit 8 receives signals indicating the light intensities of the beams measured by the photodetectors 6 and 7. The signal processing circuit 8 measures the rotation angle of the polarization plane of the laser beam on the basis of the received signals. The rotation angle of the polarization plane is expressed by a function based on the intensity of a magnetic field in the propagation direction of the laser beam (for example, refer to Expression (2) of "Resonant nonlinear magneto-optical effects in atoms" in Reviews of Modern Physics., APS through AIP, USA, October 2002, vol. 74, no. 4, p. 1153-1201, by D. Budker et al. Although Expression (2) is associated with linear optical rotation, substantially the same equation may be used even in the case of NMOR.). The signal processing circuit 8 measures the intensity of the magnetic field in the propagation direction of the laser beam from the rotation angle of the polarization plane. The display device 9 displays the intensity of the magnetic field measured by the signal processing circuit 8.

Figure 2C:
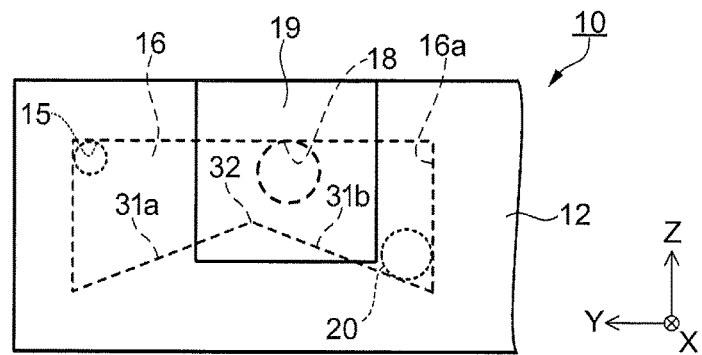
FIG. 2C is a schematic view illustrating the configuration of the gas cell according to the first embodiment.

Subsequently, the gas cell according to the first embodiment and the ampoule used in the gas cell will be described with reference to FIGS. 2A to 4C. FIGS. 2A to 2C are schematic views illustrating the configuration of the gas cell according to the first embodiment. Specifically, FIG. 2A is a schematic plan view of the gas cell, FIG. 2B is a schematic sectional view taken along line A-A' of FIG. 2A, and FIG. 2C is a partial sectional view of the gas cell.

Figure 3A:
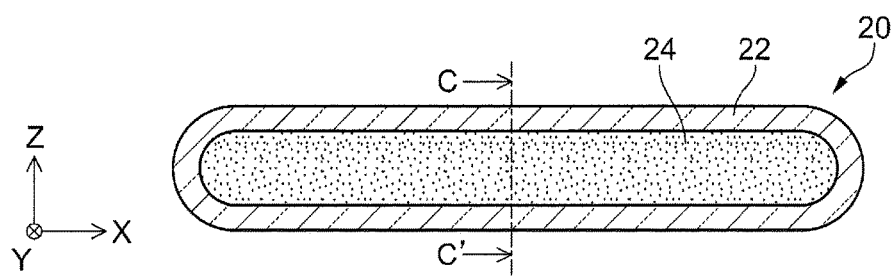
FIG. 3A is a schematic sectional view illustrating the configuration of an ampoule according to the first embodiment.
Figure 3B:
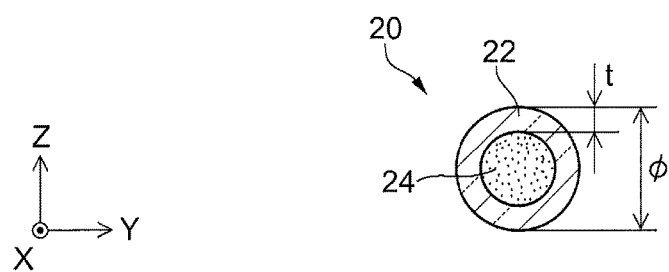
FIG. 3B is a schematic sectional view illustrating the configuration of the ampoule according to the first embodiment.
Figure 4A:
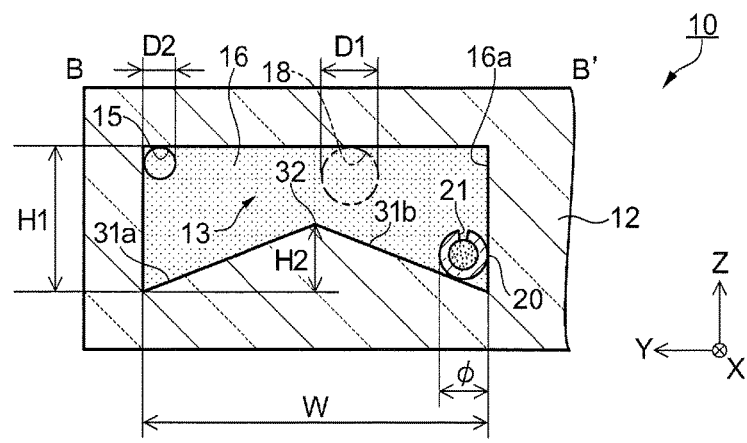
FIG. 4A is a schematic cross-sectional view illustrating the cross-sectional shape of the gas cell according to the first embodiment and the arrangement of the ampoule.
Figure 4B:
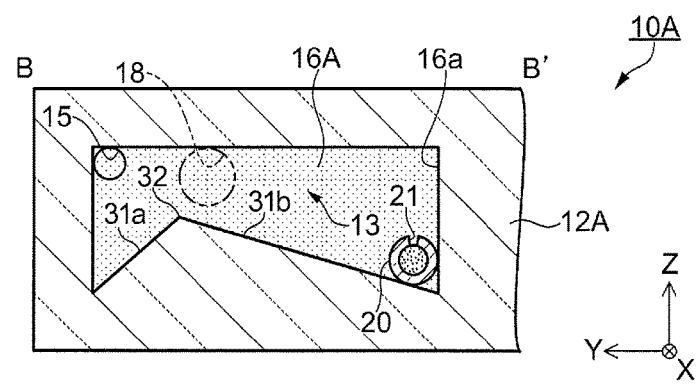
FIG. 4B is a schematic cross-sectional view illustrating the cross-sectional shape of the gas cell according to the first embodiment and the arrangement of the ampoule.
Figure 4C:
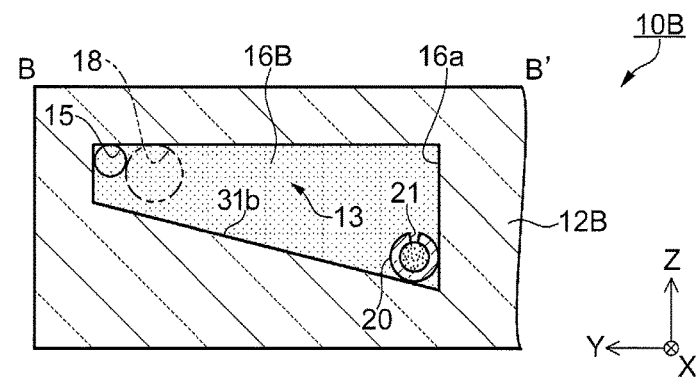
FIG. 4C is a schematic cross-sectional view illustrating the cross-sectional shape of the gas cell according to the first embodiment and the arrangement of the ampoule.

FIGS. 3A and 3B are schematic sectional views illustrating the configuration of the ampoule according to the first embodiment. Specifically, FIG. 3A is a schematic sectional view of the ampoule along the longitudinal direction thereof, and FIG. 3B is a schematic cross-sectional view taken along line C-C' of FIG. 3A. FIGS. 4A to 4C are schematic cross-sectional views illustrating the cross-sectional shapes of the gas cell according to the first embodiment and the arrangement of the ampoule. FIG. 4A is a schematic cross-sectional view taken along line A-A' of FIG. 2A, and FIGS. 4B and 4C are schematic cross-sectional views illustrating other examples of the first embodiment.

Configuration of Gas Cell

FIGS. 2A to 2C illustrate the gas cell 10 according to the first embodiment. In FIGS. 2A to 2C, the height direction of the gas cell 10 is referred to as a Z axis, and the upper side thereof is referred to as a +Z direction. The lengthwise direction of the gas cell 10 which is a direction that intersects the Z axis is referred to as an X direction as a first direction, and the right side in FIGS. 2A and 2B is referred to as a +X direction. In addition, the width direction of the gas cell 10 which is a direction that intersects the Z axis and the X axis is referred to as a Y axis as a second direction, and the left side in FIG. 2C is referred to as a +Y direction.

FIG. 2A is a plan view of the gas cell 10 when viewed from the +Z direction side, FIG. 2B is a sectional view of a section of the gas cell 10 taken along line A-A' when viewed from the −Y direction side, and FIG. 2C is a cross-sectional view of the gas cell 10 when viewed from the −X direction side. In this specification, viewing the gas cell 10 from the +Z direction side as illustrated in FIG. 2A is referred to as a "plan view". In addition, viewing the section of the gas cell 10 in a direction that intersects the section, for example, viewing the section along the X axis from the −Y direction side as illustrated in FIG. 2B, is referred to as a "sectional view".

As illustrated in FIG. 2A, the gas cell 10 according to this embodiment is constituted by a cell portion 12 and a sealing portion 19. The cell portion 12 is a box (cell) having a void therein, and for example, is formed of quartz glass. The inner wall of the cell portion 12 may be coated with, for example, paraffin. The thickness of the cell portion 12 is 1 mm to 5 mm, and for example, is about 1.5 mm.

The cell portion 12 includes, as the void included therein, a main chamber 14 as a first chamber, and a reservoir 16 as a second chamber. The main chamber 14 and the reservoir 16 are arranged along the X-axis direction and communicate with each other through a communication hole 15. An ampoule 20 is disposed in the reservoir 16. The configuration of the ampoule 20 will be described later. On the −X direction side of the reservoir 16, that is, on the opposite side of the communication hole 15, an opening 18 is provided.

In addition, line A-A' is a line that passes through the center of the opening 18, the reservoir 16, the center of the communication hole 15, and the main chamber 14 along the X-axis direction. Line B-B' is a line that passes through the reservoir 16 and the ampoule 20 along the Y-axis direction.

As illustrated in FIG. 2B, the communication hole 15 is provided on the upper side (+Z direction side) of the main chamber 14 and the reservoir 16. The opening 18 is provided on the upper side of the reservoir 16. The main chamber 14 and the reservoir 16 inside the cell portion 12 are filled with a gas of vaporized alkali metal (hereinafter, referred to as an alkali metal gas) 13. In the main chamber 14 and the reservoir 16, in addition to the alkali metal gas 13, inert gas such as noble gas may also be present.

As illustrated in FIG. 2C, the communication hole has a circular shape. The inner diameter of the communication hole 15 is, for example, about 0.4 mm to 1 mm. The opening 18 also has a circular shape. The inner diameter of the opening 18 is, for example, about 0.4 mm to 1.5 mm. The opening 18 is sealed by the sealing portion 19, and accordingly, the cell portion 12 (the main chamber 14 and the reservoir 16) is sealed. The sealing portion 19 has, for example, a rectangular shape, and may also have another shape such as a circular shape. As the material of the sealing portion 19, for example, quartz glass is used. The sealing portion 19 is fixed to the cell portion 12, for example, via low-melting-point glass frit (not illustrated) disposed in the periphery of the opening 18.

Configuration of Ampoule

As illustrated in FIG. 3A, the ampoule 20 has the longitudinal direction. FIG. 3A illustrates an X-Z section of the ampoule 20 disposed so that the longitudinal direction thereof follows the X-axis direction. The ampoule 20 is formed as a hollow glass tube 22. The glass tube 22 is, for example, formed of borosilicate glass.

The glass tube 22 extends along one direction (the X-axis direction in FIG. 3A), and both end portions thereof are welded. Accordingly, the inside of the hollow glass tube 22 is sealed. In addition, the shape of both end portions of the glass tube 22 is not limited to a round shape illustrated in FIG. 3A, and may also be a shape close to a flat surface, or a partially sharp shape. The inside of the hollow shape of the glass tube 22 is filled with an alkali metal solid (granular or powdery alkali metal atoms) 24 as the alkali metal material. As the alkali metal solid 24, as described above, rubidium, potassium, or sodium may also be used other than cesium.

FIG. 3A illustrates a state in which the ampoule 20 (glass tube 22) is sealed. In a stage in which the ampoule 20 is manufactured, the glass tube 22 is in a sealed state. However, in a stage in which the gas cell 10 is completed, a through-hole 21 is formed in the glass tube 22 and the sealing is broken (see FIG. 4A). Accordingly, the alkali metal solid 24 in the ampoule 20 is vaporized and leaks into the gas cell 10 such that the void of the cell portion 12 is filled with the alkali metal gas 13 (see FIG. 2B). In addition, so as to facilitate the vaporization and leakage of the alkali metal solid 24 from the inside of the ampoule 20, for example, a gap of about 1.5 mm is provided in the +Z direction between the upper surface of the ampoule 20 and the inner surface of the cell portion 12.

FIG. 3B illustrates a Y-Z section of the ampoule 20 in a direction that intersects the longitudinal direction thereof. As illustrated in FIG. 3B, the Y-Z cross-sectional shape of the glass tube 22 is, for example, a substantially circular shape, and may also be another shape. The outer diameter φ of the glass tube 22 is 0.2 mm≤φ≤1.2 mm. The thickness t of the glass tube 22 is 0.1 mm≤t≤0.5 mm, and is preferably about 20% of the outer diameter φ thereof. When the thickness t of the glass tube 22 is smaller than 0.1 mm, the glass tube 22 is easily broken. When the thickness t of the glass tube 22 is greater than 0.5 mm, it is difficult to perform a process of forming the through-hole 21 in the glass tube 22 (details thereof will be described later).

Cross-Sectional Shape of Gas Cell and Arrangement of Ampoule

As illustrated in FIG. 4A, the reservoir 16 includes an inclined surface 31a and an inclined surface 31b which are inclined along the Y-axis direction on the bottom portion side (−Z direction side). The inclined surface 31a is inclined from the upper side toward the bottom portion side in the +Y direction, and the inclined surface 31b is inclined from the upper side toward the bottom portion side in the −Y direction. By the two inclined surfaces 31a and 31b which are inclined toward opposite sides to each other and thus intersect each other, a convex portion which has a mountain shape in a cross-section view along the Y-axis direction is formed. An intersection portion 32 at which the inclined surfaces 31a and 31b intersect each other becomes the apex of the convex portion having a mountain shape in the cross-sectional view. In a plan view, the intersection portion 32 extends in a ridge shape along the X-axis direction (see FIG. 2A).

The ampoule 20 is positioned at the lowermost position in the inclined surface 31b, as a predetermined position in the reservoir 16. The lowermost position mentioned here indicates the lowermost position that the ampoule 20 can be disposed (closest to the −Z direction side). In this embodiment, the position at which the ampoule 20 comes into contact with the inclined surface 31b and a side wall 16a of the reservoir 16 becomes the lowermost position. The ampoule 20 is disposed so that the longitudinal direction thereof follows the extension direction of the intersection portion 32, that is, the X-axis direction (see FIG. 2A). In other words, the ampoule 20 is disposed so that the longitudinal direction thereof follows the extension direction of the side wall 16a, that is, the X-axis direction (see FIG. 2A). Accordingly, the ampoule 20 is held in the reservoir 16 in a stable state.

In FIG. 4A, a position at which the opening 18 that is disposed on the −X direction side of the reservoir 16 is projected on the cross-section taken along line B-B' is indicated by two-dot chain line. The opening 18 is provided at a position that is distant from the above-mentioned predetermined position at which the ampoule 20 is disposed, in the +Y direction. More specifically, the opening 18 is provided at a position which is provided between the predetermined position at which the ampoule 20 is disposed and the intersection portion 32 in the Y-axis direction, that is, a position higher than the predetermined lowermost position in the inclined surface 31b and is higher than the inclined surface 31b.

The opening 18 is a hole through which the ampoule 20 is accommodated in the reservoir 16. Since the opening 18 is provided at the upper position in the inclined surface 31b, the ampoule 20 inserted through the opening 18 moves toward the predetermined position, that is, the lowermost position, along the inclined surface 31b.

It is preferable that the communication hole 15 is provided at a position that is distant from the above-mentioned predetermined position at which the ampoule 20 is disposed. The communication hole 15 is a hole through which the alkali metal gas 13 obtained through the vaporization of the alkali metal solid 24 leaks from the inside of the reservoir 16 into the main chamber 14. On the other hand, when fragments of the glass tube 22 generated when the through-hole 21 is formed in the ampoule 20 or the alkali metal solid 24 discharged from the ampoule 20 infiltrate into the main chamber 14 through the communication hole 15, a decrease in the measurement accuracy of the magnetism measuring device 100 is incurred. Therefore, it is preferable that the communication hole 15 is provided at a high position in the reservoir 16. In addition, the position of the communication hole 15 relative to the opening 18 is not particularly limited.

Here, the diameter of the ampoule 20 is referred to as $\varphi$, the inner diameter of the opening 18 is referred to as D1, and the inner diameter of the communication hole 15 is referred to as D2. In addition, the width of the inside of the reservoir 16 is referred to as W, the height of the inside thereof is referred to as H1, and the height of the intersection portion 32 is referred to as H2. The ampoule 20 has to pass through the opening 18, and it is preferable that the ampoule 20 does not pass through the communication hole 15. Therefore, $D2<\varphi<D1$ is satisfied. In order to allow the ampoule 20 to be easily accommodated in the reservoir 16 and to be held at the predetermined position in a stable state, $\varphi/2<H2<(H1-\varphi)$, and $H2\leq(H1-D1)$ are satisfied, and it is preferable that $4\varphi<W$ is satisfied.

For example, when the diameter $\varphi$ of the ampoule 20 is set to 1.0 mm, the inner diameter D1 of the opening 18 may be set to about 1.2 mm, and the inner diameter D2 of the communication hole 15 may be set to about 0.4 mm. In addition, the width W of the inside of the reservoir 16 may be set to about 5.0 mm, the height H1 of the inside thereof may be set to 2.5 mm, and the height H2 of the intersection portion 32 may be set to about 1.2 mm.

In addition, the cross-sectional shape of the reservoir 16 of the gas cell 10 according to the first embodiment is not limited to the shape illustrated in FIG. 4A. The cross-sectional shape of the reservoir 16 may also be, for example, a shape having different inclined surfaces as illustrated in FIG. 4B or 4C.

In a gas cell 10A illustrated in FIG. 4B, a reservoir 16A of a cell portion 12A includes the inclined surface 31a and the inclined surface 31b on the bottom portion side, and the lengths thereof (the widths thereof in the Y-axis direction) are different from each other. In other words, the position of the intersection portion 32 where the two inclined surfaces 31a and 31b intersect each other is shifted from the center position of the reservoir 16A in the Y-axis direction toward the +Y direction side.

In a case where the ampoule 20 is disposed on the inclined surface 31b which is longer, the opening 18 is provided to be shifted from the center position of the reservoir 16A in the Y-axis direction toward the +Y direction side so as to be positioned above the inclined surface 31b. Even in this configuration, the same effects as those of the gas cell 10 illustrated in FIG. 4A are obtained. In addition, in the example illustrated in FIG. 4B, the inclination angle of the inclined surface 31a and the inclination angle of the inclined surface 31b are different from each other, but the two may also be the same.

In a gas cell 10B illustrated in FIG. 4C, a reservoir 16B of a cell portion 12B includes only the inclined surface 31b on the bottom portion side. Therefore, in the gas cell 10B, the intersection portion 32 is not present, and the opening 18 is positioned above the inclined surface 31b, that is, a position closer to the communication hole 15. Even in this configuration, the same effects as those of the gas cell 10 illustrated in FIG. 4A are obtained.

Manufacturing Method of Gas Cell (Example 1 of Manufacturing Method)

Figure 5A:
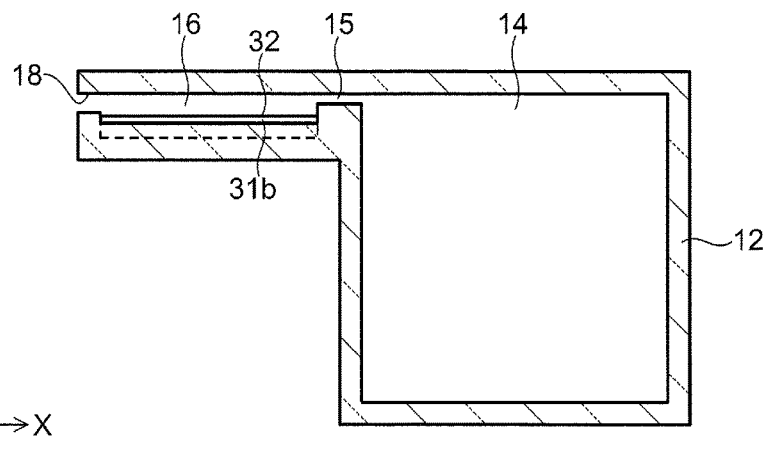
FIG. 5A is a view illustrating a manufacturing method of the gas cell according to the first embodiment.
Figure 5B:
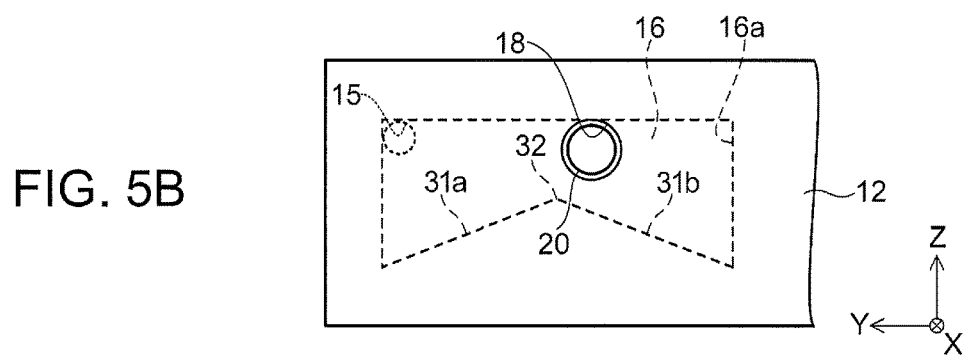
FIG. 5B is a view illustrating the manufacturing method of the gas cell according to the first embodiment.
Figure 5C:
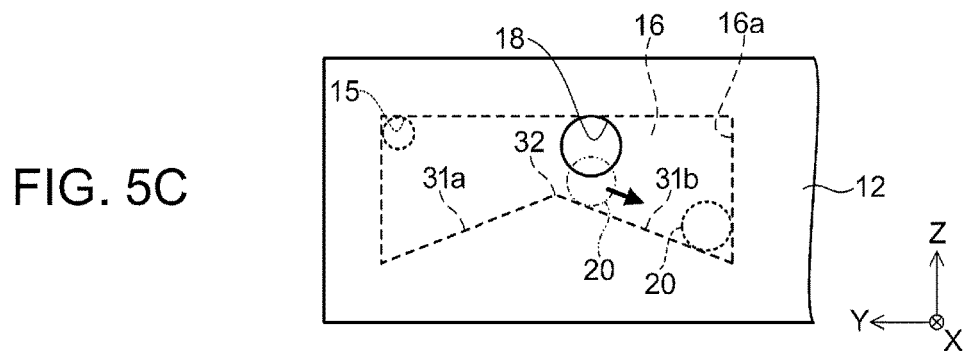
FIG. 5C is a view illustrating the manufacturing method of the gas cell according to the first embodiment.

Next, Example 1 of a manufacturing method of the gas cell 10 will be described with reference to FIGS. 5A to 6C. FIGS. 5A to 6C are views illustrating a manufacturing method of the gas cell according to the first embodiment. Specifically, FIG. 5A is a schematic sectional view corresponding to FIG. 2B, FIGS. 5B, 5C, and 6A are side views corresponding to FIG. 2C, and FIGS. 6B and 6C are cross-sectional views corresponding to FIG. 4A.

First, the cell portion 12 illustrated in FIG. 5A is prepared. Although not illustrated, for example, by cutting a glass plate made of quartz glass, glass plate members corresponding to the wall surfaces constituting the cell portion 12 are prepared. In addition, the glass plate members are assembled, and the glass plate members are joined together by an adhesive or welding, thereby obtaining the cell portion having the main chamber 14 and the reservoir 16 as illustrated in FIG. 5A. In this stage, the opening 18 of the cell portion 12 is open. In addition, the inclined surfaces 31a and 31b (see FIG. 4A) in the reservoir 16 can be formed by processing the glass plate members and forming inclined surfaces, or by obliquely arranging the glass plate members and joining them together.

Subsequently, the ampoule 20 is accommodated in the reservoir 16 of the cell portion 12 (arranging process). As illustrated in FIG. 5B, the ampoule 20 is inserted through the opening 18 provided on the reservoir 16 side of the cell portion 12 and is accommodated in the reservoir 16. As illustrated in FIG. 5C, since the opening 18 is at a higher position than the inclined surface 31b, the ampoule 20 inserted through the opening 18 falls on the inclined surface 31b. In addition, since the opening 18 is provided near the intersection portion 32, the drop of the ampoule 20 that occurs when the ampoule 20 is inserted through the opening 18 and falls on the inclined surface 31b is reduced, and thus the risk of carelessly breaking the ampoule 20 due to an impact or the like can be reduced.

In addition, the opening 18 is disposed above the inclined surface 31b with respect to the predetermined position at which the ampoule 20 is disposed. Therefore, the ampoule 20 slips on the inclined surface 31b or rolls on the inclined surface 31b about its longitudinal direction as the rotation axis and thus moves to the bottom portion side indicated by arrow along the inclined surface 31b. In addition, the ampoule 20 stops at the position at which the ampoule 20 comes into contact with the side wall 16a, that is, the predetermined position. At this time, the ampoule 20 is guided by the inclined surface 31b and the side wall 16a and is thus disposed so that the longitudinal direction thereof follows the X-axis direction. Therefore, the ampoule 20 can be easily disposed at the predetermined position in the reservoir 16.

In addition, in this stage, the ampoule 20 is in a state of being filled with the alkali metal solid 24 in the hollow glass tube 22 and sealed as illustrated in FIG. 3A. The ampoule 20 is formed by filling the inside of the hollow of the tubular glass tube 22 with the alkali metal solid 24 under an atmosphere at a low pressure close to vacuum (ideally, under vacuum) and welding and sealing both end portions of the glass tube 22. The alkali metal such as cesium used as the alkali metal solid 24 has high reactivity and cannot be treated in the air, and is thus accommodated in the cell portion 12 in a state of being sealed in the ampoule 20 under the environment at a low pressure.

Figure 6A:
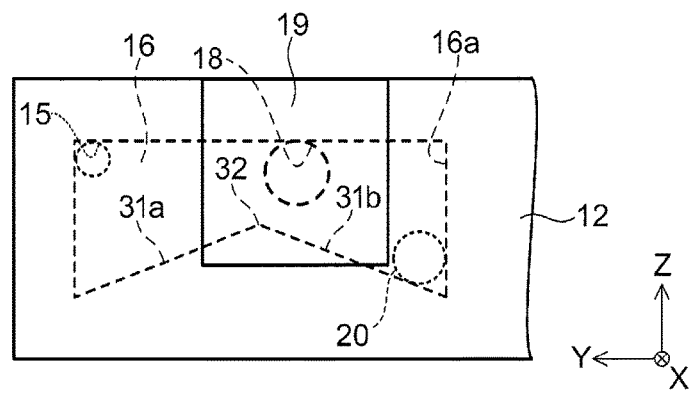
FIG. 6A is a view illustrating the manufacturing method (Example 1) of the gas cell according to the first embodiment.
Figure 6B:
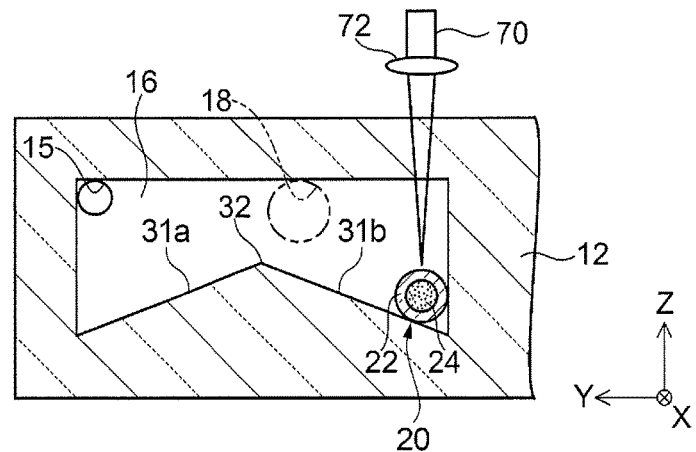
FIG. 6B is a view illustrating the manufacturing method (Example 1) of the gas cell according to the first embodiment.
Figure 6C:
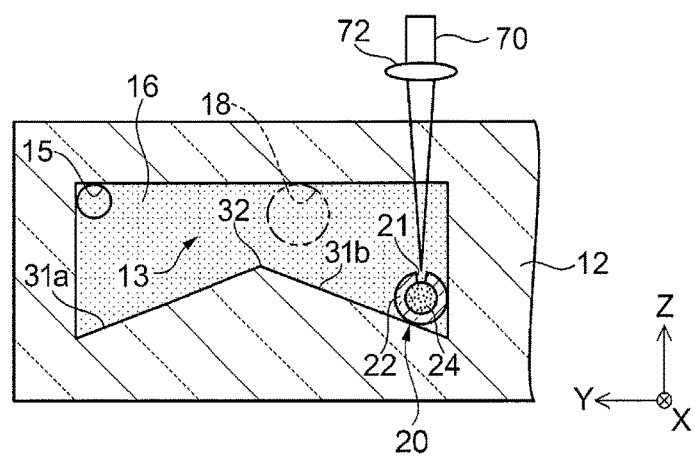
FIG. 6C is a view illustrating the manufacturing method (Example 1) of the gas cell according to the first embodiment.

Subsequently, as illustrated in FIG. 6A, evacuation of the inside of the cell portion 12 is sufficiently performed, and in a state where an excessively small amount of impurities is present in the internal void, the cell portion 12 (the main chamber 14, the communication hole 15, and the reservoir 16) is sealed (sealing process). For example, under the environment at a low pressure closer to vacuum (ideally, under vacuum), low-melting-point glass frit (not illustrated) is disposed on at least one of the cell portion 12 and the sealing portion 19 in the periphery of the opening 18, and the cell portion 12 and the sealing portion 19 are fixed to each other and sealed, thereby sealing the cell portion 12.

In addition, during handling from the arranging process of accommodating the ampoule 20 to the sealing process or during the sealing process, there is a need to be careful not to cause the ampoule 20 accommodated in the reservoir 16 to come out of the cell portion 12 through the opening 18. The postures of the cell portion 12 and the sealing portion 19 or the positional relationship therebetween in the sealing process is not particularly limited. However, for example, in a case where the cell portion 12 is disposed so that the side on which the opening 18 is formed is disposed on the lower side with respect to the sealing portion 19 installed on the lower side, there may be a case where the ampoule 20 accommodated in the reservoir 16 comes out of the cell portion 12 through the opening 18 disposed on the lower side. In this embodiment, since the opening 18 is provided at a position that is distant from the predetermined position at which the ampoule 20 is disposed and is higher than the predetermined position, the risk of causing the ampoule 20 to come out of the cell portion 12 can be suppressed.

Subsequently, as illustrated in FIG. 6B, pulsed laser light 70 is concentrated on a condensing lens 72, and irradiates the glass tube 22 of the ampoule 20 via the cell portion 12. Accordingly, as illustrated in FIG. 6C, the through-hole 21 is formed in the glass tube 22 such that the alkali metal solid 24 in the ampoule 20 is vaporized and leaks into the void of the gas cell 10. Since laser light has excellent directivity and convergence, the through-hole 21 can be easily formed in the glass tube 22 by emitting the pulsed laser light 70 thereto.

Here, the through-hole 21 needs to be formed in the glass tube 22 of the ampoule 20 without damaging the cell portion 12. In a case where the cell portion 12 is formed of quartz glass and the glass tube 22 is formed of borosilicate glass, for example, the pulsed laser light 70 having a wavelength in the ultraviolet region is used. Light having a wavelength in the ultraviolet region is transmitted through quartz glass but is slightly absorbed by borosilicate glass. Accordingly, the through-hole 21 can be formed by selectively processing the glass tube 22 of the ampoule 20 without damaging the cell portion 12.

By forming the through-hole 21 in the ampoule 20, the sealing of the ampoule 20 is broken in the reservoir 16 of the cell portion 12, and the alkali metal solid 24 is vaporized from the ampoule 20, is transitioned into the alkali metal gas 13, and leaks. As illustrated in FIG. 2B, the alkali metal gas 13 that leaks into the reservoir 16 flows into the main chamber 14 of the cell portion 12 through the communication hole 15 and diffuses. As a result, the void of the cell portion 12 is filled with the alkali metal gas 13.

However, in the process illustrated in FIG. 6B, when the bottom portion of the reservoir 16 is a flat surface, the ampoule 20 is not held in a stable state in the reservoir 16, and for example, the ampoule 20 may be shifted from the predetermined position by a small degree of inclination and impact when the cell portion 12 is handled. In addition, when the ampoule 20 is not held in a stable state, the ampoule 20 may be moved and shifted from the predetermined position by the irradiation of the pulsed laser light 70.

When the pulsed laser light 70 is emitted, if the position of the ampoule 20 is shifted and varies with each individual ampoule or the ampoule 20 is moved, the irradiation position of the pulsed laser light 70 with respect to the ampoule 20 is shifted. In this case, processing performed in a depth direction does not progress, and the glass tube 22 cannot be penetrated, which causes a decrease in the manufacturing yield during the process of manufacturing the gas cell 10 and an increase in the number of manufacturing processes due to the repeated processing.

In this embodiment, since the inclined surfaces 31a and 31b are provided on the bottom portion side of the reservoir 16, the ampoule 20 is disposed at a predetermined position along the X-axis direction in the reservoir 16, and is held in the position in a stable state. Therefore, variations in the position of the ampoule 20 in the reservoir 16 or the movement of the ampoule 20 due to impact can be prevented. Accordingly, the through-hole 21 can be stably and reliably formed in the ampoule 20, and thus a decrease in the manufacturing yield of the gas cell 10 and an increase in the number of manufacturing processes are suppressed, thereby enhancing productivity.

In addition, in the process of forming the through-hole 21 in the ampoule 20, the alkali metal solid 24 may be vaporized and leak from the inside of the ampoule 20. Therefore, without limitation to the formation of the through-hole 21, for example, cracks may be caused to occur in the glass tube 22 to separate the ampoule 20, or the glass tube 22 may be broken. However, in this case, when fragments of the glass tube 22 or the alkali metal solid 24 discharged from the ampoule 20 infiltrate into the main chamber 14 through the communication hole 15, a decrease in the measurement accuracy of the magnetism measuring device 100 is incurred.

In this embodiment, since the communication hole 15 is provided at a position that is distant from the predetermined position at which the ampoule 20 is disposed and at a high position in the reservoir 16, the infiltration of fragments of the glass tube 22 or the alkali metal solid 24 into the main chamber 14 can be prevented. Accordingly, the magnetism measuring device 100 having excellent measurement accuracy can be manufactured and provided.

In addition, the manufacturing method of the magnetism measuring device 100 according to this embodiment includes the manufacturing method of the above-described gas cell 10. In the process of manufacturing the magnetism measuring device 100 according to this embodiment, well-known methods can be used in processes other than the process of manufacturing the gas cell 10, and thus the description thereof will not be repeated.

Second Embodiment

A second embodiment is different from the first embodiment in the cross-sectional shape of the reservoir 16 in which the cross-section formed by the two inclined surfaces 31a and 31b is formed as a concave portion having a valley shape. The configurations and cross-sectional shapes of a gas cell according to the second embodiment and the arrangement of the ampoule will be described with reference to FIGS. 7A to 8B for the differences from the first embodiment. Like elements which are similar to those of the first embodiment are denoted by like reference numerals, and description thereof will not be repeated.

Figure 7A:
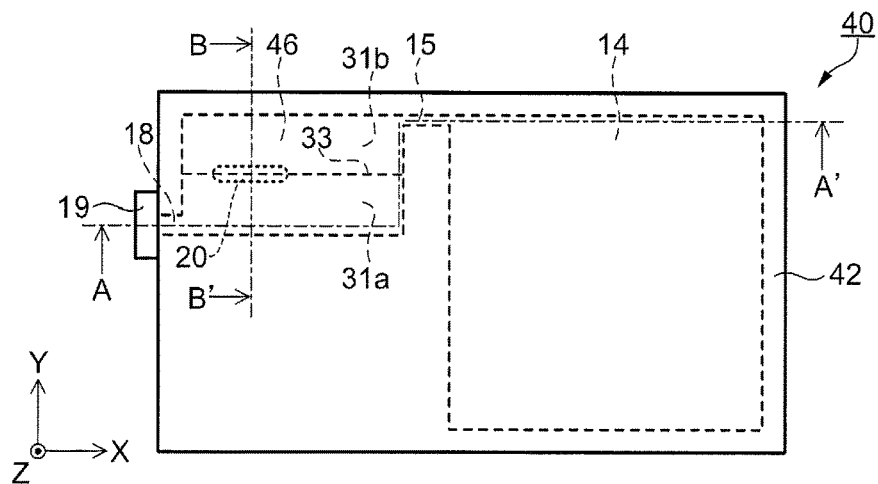
FIG. 7A is a schematic view illustrating the configuration of a gas cell according to a second embodiment.
Figure 7B:
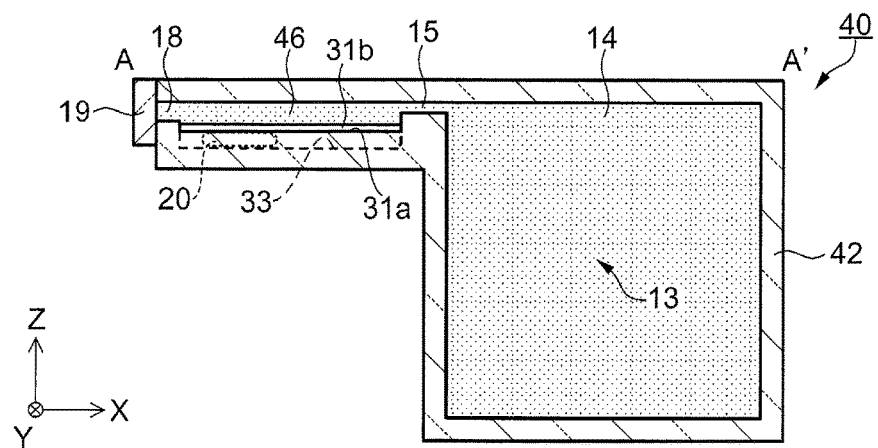
FIG. 7B is a schematic view illustrating the configuration of the gas cell according to the second embodiment.
Figure 7C:
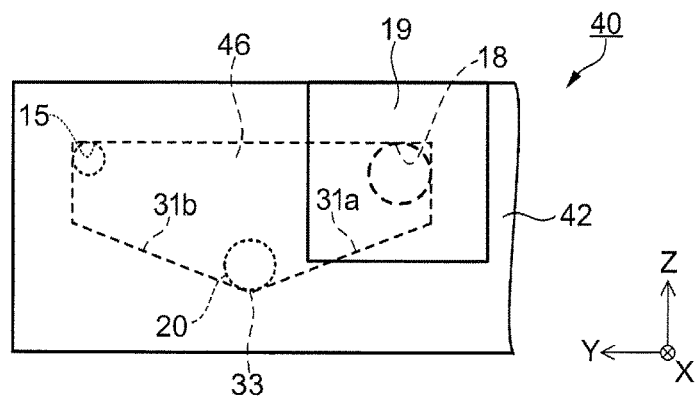
FIG. 7C is a schematic view illustrating the configuration of the gas cell according to the second embodiment.
Figure 8A:
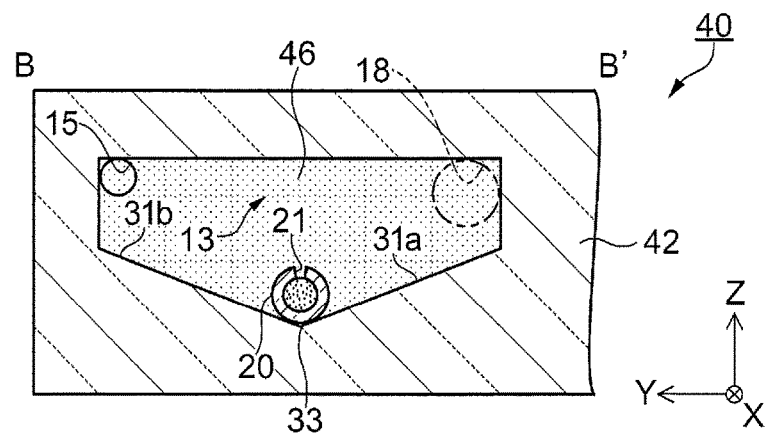
FIG. 8A is a schematic cross-sectional view illustrating the cross-sectional shape of the gas cell according to the second embodiment and the arrangement of the ampoule.
Figure 8B:
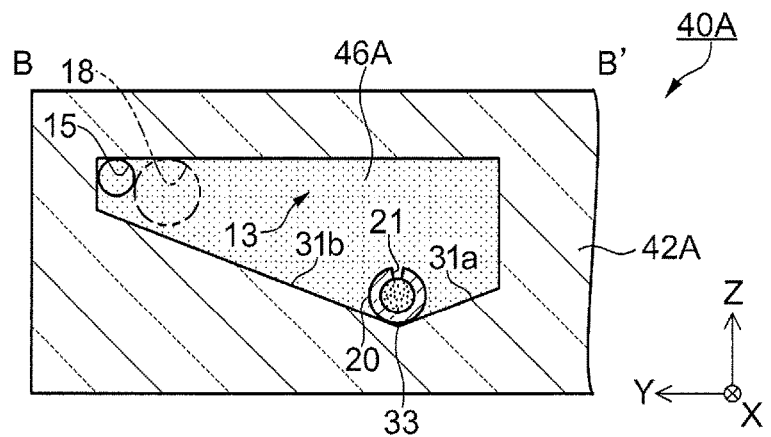
FIG. 8B is a schematic cross-sectional view illustrating the cross-sectional shape of the gas cell according to the second embodiment and the arrangement of the ampoule.

FIGS. 7A and 7B are schematic views illustrating the configuration of the gas cell according to the second embodiment. Specifically, FIG. 7A is a schematic plan view of the gas cell, FIG. 7B is a schematic sectional view taken along line A-A' of FIG. 7A, and FIG. 7C is a partial sectional view of the gas cell. FIGS. 8A and 8B are schematic cross-sectional views illustrating the cross-sectional shapes of the gas cell according to the second embodiment and the arrangement of the ampoule. FIG. 8A is a schematic cross-sectional view taken along line A-A' of FIG. 7A, and FIG. 8B is a schematic cross-sectional view illustrating another example of the second embodiment.

Configuration of Gas Cell

As illustrated in FIG. 7A, a gas cell 40 according to the second embodiment is constituted by a cell portion 42 and the sealing portion 19. The cell portion 42 includes, as the void included therein, the main chamber 14, and a reservoir 46. In the plan view, the arrangement of the main chamber 14, the communication hole 15, and the reservoir 46 is substantially the same as that of the first embodiment. However, in the plan view, a predetermined position at which the ampoule 20 is disposed in the reservoir 46 and the position of the opening 18 are different from those of the first embodiment.

As illustrated in FIG. 7B, a section taken along line A-A' that passes through the center of the communication hole 15 and the center of the opening 18 along the X-axis direction of the gas cell 40 is substantially the same as the first embodiment except that the positional relationship between the two inclined surfaces 31a and 31b, which will be described later, is different. As illustrated in FIG. 7C, the opening 18 is provided at a position that is distant from the predetermined position at which the ampoule 20 is disposed in the −Y direction. The sealing portion 19 is disposed at a position corresponding to the opening 18.

Cross-Sectional Shape of Gas Cell and Arrangement of Ampoule

As illustrated in FIG. 8A, the reservoir 46 includes an inclined surface 31a and an inclined surface 31b which are inclined along the Y-axis direction on the bottom portion side. However, the positional relationship between the inclined surfaces 31a and 31b in the Y-axis direction is opposite to that of the first embodiment. Therefore, by the two inclined surfaces 31a and 31b which are inclined toward the opposite sides to each other and thus intersect each other, a concave portion which has a valley shape in a cross-section view along the Y-axis direction is formed. An intersection portion 33 at which the inclined surfaces 31a and 31b intersect each other becomes the valley bottom of the concave portion having a valley shape in the cross-sectional view. In the plan view, the intersection portion 33 extends along the X-axis direction, and the ampoule 20 is disposed at a position that overlaps the intersection portion 33 (see FIG. 7A).

The ampoule 20 is positioned at the lowermost position in the inclined surfaces 31a and 31b as a predetermined position in the reservoir 46, that is, at the intersection portion 33 which acts as the valley bottom of the concave portion. The opening 18 is provided on the −Y direction side with respect to the intersection portion 33. That is, the opening 18 is disposed above the inclined surface 31a with respect to the predetermined position at which the ampoule 20 is disposed. Therefore, when the ampoule 20 is inserted into the reservoir 46 through the opening 18, the ampoule 20 moves toward the +Y direction side on the inclined surface 31a and stops at the position of the intersection portion 33 which is lowest in position, that is, the predetermined position.

At this time, the ampoule 20 is guided by the inclined surfaces 31a and 31b and is thus disposed so that the longitudinal direction thereof follows the X-axis direction. Therefore, the ampoule 20 can be easily disposed at the predetermined position in the reservoir 46. In addition, the ampoule 20 comes into contact with the inclined surfaces 31a and 31b at the predetermined position and is held in a stable state so that the longitudinal direction thereof follows the X-axis direction. Therefore, even in the second embodiment, as in the first embodiment, the through-hole 21 can be stably and reliably formed in the ampoule 20.

Here, when the inclination angle of the inclined surface 31a and the inclination angle of the inclined surface 31b are the same, even in a case where the diameter φ (see FIG. 4A) of the ampoule 20 varies, the center of the ampoule 20 is disposed at the position that overlaps the intersection portion 33 in the plan view. Therefore, even when the diameter φ of the ampoule 20 is different or varies, the position irradiated with the pulsed laser light 70 can be easily aligned with the center position of the ampoule 20 in the process of forming the through-hole 21 in the ampoule 20.

Therefore, according to the configuration of the reservoir 46 according to the second embodiment, compared to the first embodiment, even in a case where the diameter φ of the ampoule 20 is different or varies, the through-hole 21 can be stably and reliably formed in the ampoule 20. Therefore, a decrease in the manufacturing yield of the gas cell 40 and an increase in the number of manufacturing processes are more effectively suppressed, and thus it is possible to further enhance productivity.

In addition, the cross-sectional shape of the reservoir 46 of the gas cell 40 according to the second embodiment is not limited to the shape illustrated in FIG. 8A. The cross-sectional shape of the reservoir 46 may also be, for example, a shape having different inclined surfaces as illustrated in FIG. 8B.

In a gas cell 40A illustrated in FIG. 8B, a reservoir 46A of a cell portion 42A includes the inclined surface 31a and the inclined surface 31b on the bottom portion side, and the lengths thereof (the widths thereof in the Y-axis direction) are different from each other. In other words, the position of the intersection portion 33 where the two inclined surfaces 31a and 31b intersect each other is shifted from the center position of the reservoir 46A in the Y-axis direction toward the −Y direction side. The opening 18 is provided to be shifted from the center position of the reservoir 46A in the Y-axis direction toward the +Y direction side so as to be positioned above the inclined surface 31b which is longer. Even in this configuration, the same effects as those of the gas cell 40 illustrated in FIG. 8A are obtained.

Third Embodiment

A third embodiment is different from the first embodiment in the inclination directions of the two inclined surfaces of the reservoir and the longitudinal direction of the disposed ampoule. The configurations and cross-sectional shapes of a gas cell according to the third embodiment and the arrangement of the ampoule will be described with reference to FIGS. 9A to 9D for the differences from the first embodiment. Like elements which are similar to those of the first embodiment are denoted by like reference numerals, and description thereof will not be repeated.

Figure 9A:
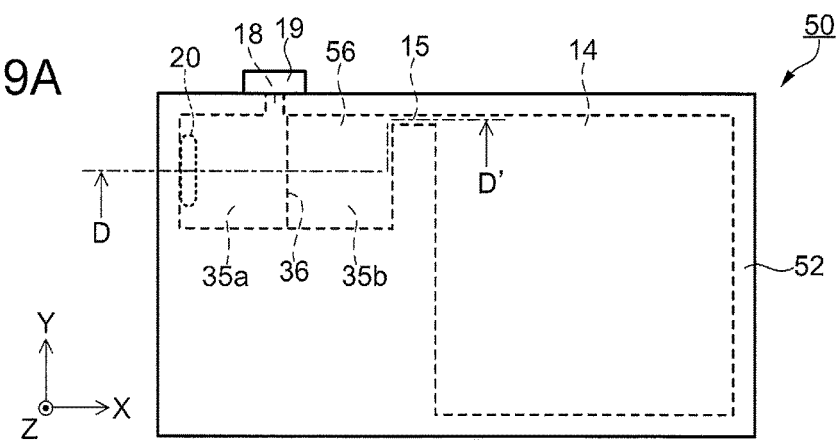
FIG. 9A is a schematic view illustrating the configuration of a gas cell according to a third embodiment.
Figure 9B:
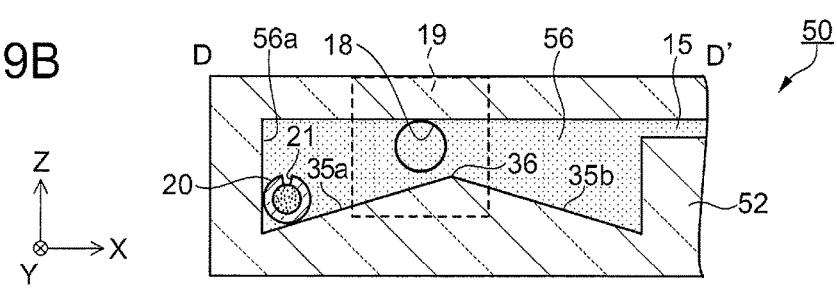
FIG. 9B is a schematic view illustrating the configuration of the gas cell according to the third embodiment.
Figure 9C:
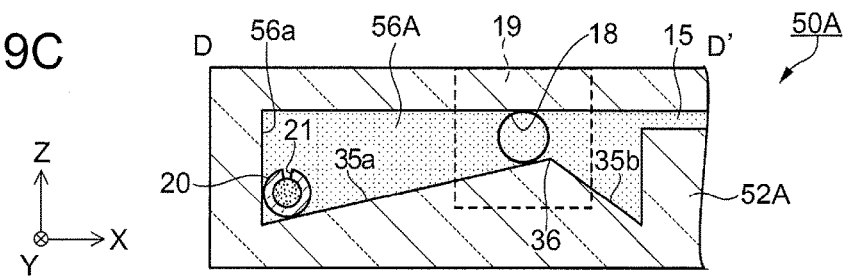
FIG. 9C is a schematic view illustrating the configuration of the gas cell according to the third embodiment.
Figure 9D:
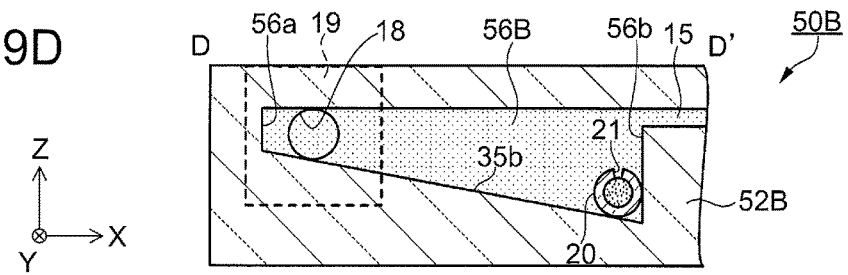
FIG. 9D is a schematic view illustrating the configuration of the gas cell according to the third embodiment.

FIGS. 9A to 9D are schematic views illustrating the configuration of the gas cell according to the third embodiment. Specifically, FIG. 9A is a schematic plan view of the gas cell, FIG. 9B is a schematic cross-sectional view taken along line D-D' of FIG. 9A, and FIGS. 9C and 9D are partial cross-sectional views illustrating other examples of the third embodiment.

Configuration of Gas Cell

As illustrated in FIG. 9A, a gas cell 50 according to the third embodiment is constituted by a cell portion 52 and the sealing portion 19. The cell portion 52 includes, as the void included therein, the main chamber 14, and a reservoir 56. In the plan view, the arrangement of the main chamber 14, the communication hole 15, and the reservoir 56 are substantially the same as that of the first embodiment. However, in the plan view, a predetermined position at which the ampoule 20 is disposed in the reservoir 56, the direction thereof, and the position of the opening 18 are different from those of the first embodiment.

The reservoir 56 includes an inclined surface 35a and an inclined surface 35b which are inclined along the X-axis direction, on the bottom portion side. The ampoule 20 is disposed so that the longitudinal direction thereof follows the Y-axis direction. The opening 18 is provided on the +Y direction side of the reservoir 56. The sealing portion 19 is disposed at a position corresponding to the opening 18. In addition, line D-D' is a line that passes through the reservoir 56, the ampoule 20, and the center of the communication hole 15 along the X-axis direction.

Cross-Sectional Shape of Gas Cell and Arrangement of Ampoule

As illustrated in FIG. 9B, the inclined surface 35a is inclined from the upper side toward the bottom portion side in the −X direction, and the inclined surface 35b is inclined from the upper side toward the bottom portion side in the +X direction. By the two inclined surfaces 35a and 35b which are inclined toward the opposite sides to each other and thus intersect each other, a convex portion which has a mountain shape in a cross-section view along the X-axis direction is formed. An intersection portion 36 at which the inclined surfaces 35a and 35b intersect each other becomes the apex of the convex portion having a mountain shape in the cross-sectional view. In a plan view, the intersection portion 36 extends in a ridge shape along the Y-axis direction (see FIG. 9A).

The ampoule 20 is positioned at the lowermost position in the inclined surface 35a, as a predetermined position in the reservoir 56. In this embodiment, the position at which the ampoule 20 comes into contact with the inclined surface 35a and a side wall 56a of the reservoir 56 becomes the lowermost position. The ampoule 20 is disposed so that the longitudinal direction thereof follows the extension direction of the intersection portion 36, that is, the Y-axis direction (see FIG. 9A).

The opening 18 is provided at a position that is distant from the above-mentioned predetermined position at which the ampoule 20 is disposed, in the +X direction. More specifically, the opening 18 is provided at a position which is provided between the predetermined position at which the ampoule 20 is disposed and the intersection portion 36 in the X-axis direction, that is, a position higher than the predetermined lowermost position in the inclined surface 35a and higher than the inclined surface 35a.

Therefore, the ampoule 20 inserted through the opening 18 rolls on the inclined surface 35a and moves to the predetermined position that is the lowermost position. In addition, the ampoule 20 comes into contact with the inclined surface 35a and the side wall 56a of the reservoir 56 and is held in a stable state so that the longitudinal direction thereof follows the Y-axis direction. Therefore, even in the third embodiment, as in the first embodiment, the through-hole 21 can be stably and reliably formed in the ampoule 20.

The communication hole 15 is provided at a position that is distant from the above-mentioned predetermined position at which the ampoule 20 is disposed, and at a high position in the reservoir 56. Therefore, while suppressing the infiltration of fragments of the glass tube 22 which are generated when the through-hole 21 is formed in the ampoule 20, or the alkali metal solid 24 discharged from the ampoule 20, into the main chamber 14, the alkali metal gas 13 obtained through the vaporization of the alkali metal solid 24 in the reservoir 56 can be allowed to leak into the main chamber 14.

In addition, the cross-sectional shape of the reservoir 56 of the gas cell 50 according to the third embodiment is not limited to the shape illustrated in FIG. 9B. The cross-sectional shape of the reservoir 56 may also be, for example, a shape having different inclined surfaces as illustrated in FIG. 9C or 9D.

In a gas cell 50A illustrated in FIG. 9C, a reservoir 56A of a cell portion 52A includes the inclined surface 35a and the inclined surface 35b on the bottom portion side, and the lengths thereof (the widths thereof in the X-axis direction) are different from each other. In other words, the position of the intersection portion 36 where the two inclined surfaces 35a and 35b intersect each other is shifted from the center position of the reservoir 56A in the X-axis direction toward the +X direction side.

In a case where the ampoule 20 is disposed on the inclined surface 35a which is longer, the opening 18 is provided to be shifted from the center position of the reservoir 56A in the X-axis direction toward the +X direction side so as to be positioned above the inclined surface 35a. Even in this configuration, the same effects as those of the gas cell 50 illustrated in FIG. 9B are obtained. In addition, in the example illustrated in FIG. 9C, the inclination angle of the inclined surface 35a and the inclination angle of the inclined surface 35b are different from each other, but the two may also be the same.

In a gas cell 50B illustrated in FIG. 9D, a reservoir 56B of a cell portion 52B includes only the inclined surface 35b on the bottom portion side. Therefore, in the gas cell 50B, the intersection portion 36 is not present, and the opening 18 is positioned above the inclined surface 35b, that is, a position closer to the communication hole 15. Even in this configuration, the same effects as those of the gas cell 50 illustrated in FIG. 9B are obtained.

Fourth Embodiment

A fourth embodiment is different from the third embodiment in that the cross-section formed by the two inclined surfaces 35a and 35b is formed as a concave portion having a valley shape. The cross-sectional shapes of a gas cell according to the fourth embodiment and the arrangement of the ampoule will be described with reference to FIGS. 10A and 10B for the differences from the third embodiment. Like elements which are similar to those of the third embodiment are denoted by like reference numerals, and description thereof will not be repeated.

Figure 10A:
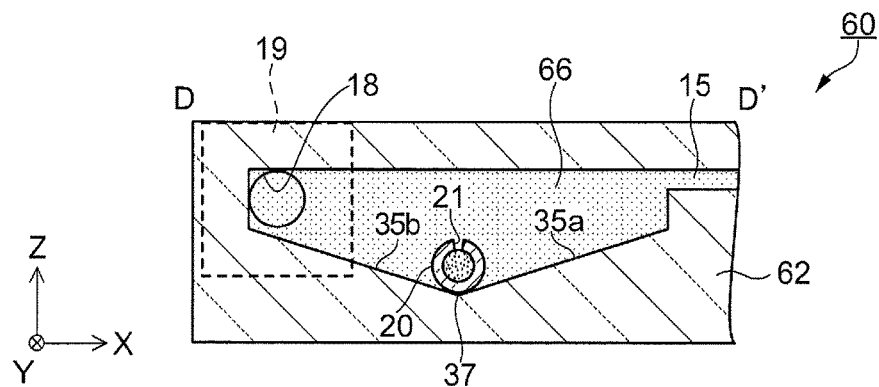
FIG. 10A is a schematic cross-sectional view illustrating the cross-sectional shape of a gas cell according to a fourth embodiment and the arrangement of the ampoule.
Figure 10B:
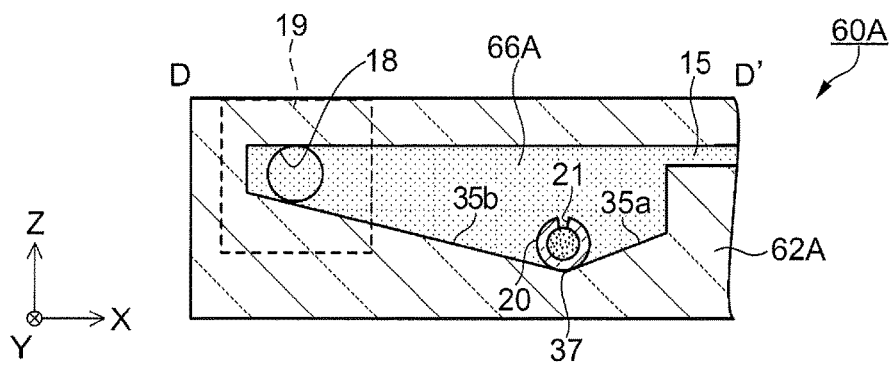
FIG. 10B is a schematic cross-sectional view illustrating the cross-sectional shape of the gas cell according to the fourth embodiment and the arrangement of the ampoule.

FIGS. 10A and 10B are schematic cross-sectional views illustrating the cross-sectional shapes of the gas cell according to the fourth embodiment and the arrangement of the ampoule. Specifically, FIG. 10A is a schematic cross-sectional view of the gas cell, and FIG. 10B is a schematic cross-sectional view illustrating another example of the fourth embodiment.

Configuration of Gas Cell

As illustrated in FIG. 10A, a gas cell 60 according to the fourth embodiment is constituted by a cell portion 62 and the sealing portion 19. The cell portion 62 includes, as the void included therein, the main chamber 14 (not illustrated), and a reservoir 66. In the plan view, the arrangement of the main chamber 14, the communication hole 15, and the reservoir 66 are substantially the same as that of the third embodiment illustrated in FIG. 9A. In addition, FIG. 10A corresponds to a schematic cross-sectional view taken along line D-D' of FIG. 9A.

Cross-Sectional Shape of Gas Cell and Arrangement of Ampoule

The reservoir 66 includes the inclined surface 35a and the inclined surface 35b which are inclined along the X-axis direction on the bottom portion side. However, the positional relationship between the inclined surfaces 35a and 35b in the X-axis direction is opposite to that of the third embodiment. Therefore, by the two inclined surfaces 35a and 35b which are inclined toward the opposite sides to each other and thus intersect each other, a concave portion which has a valley shape in a cross-section view along the X-axis direction is formed as described in the second embodiment, and an intersection portion 37 at which the inclined surfaces 35a and 35b intersect each other becomes the valley bottom of the concave portion having a valley shape in the cross-sectional view. Although not illustrated, the intersection portion 37 extends along the Y-axis direction, and the ampoule 20 is disposed at a position that overlaps the intersection portion 37.

The ampoule 20 is positioned at the intersection portion 37 which acts as the valley bottom of the concave portion, as a predetermined position in the reservoir 66. The opening 18 is disposed above the inclined surface 35b with respect to the predetermined position at which the ampoule 20 is disposed. Therefore, when the ampoule 20 is inserted into the reservoir 66 through the opening 18, the ampoule 20 moves toward the +X direction side on the inclined surface 35b and stops at the position of the intersection portion 37 which is lowest in position, that is, the predetermined position.

In the fourth embodiment, as in the second embodiment, the ampoule 20 is guided by the inclined surfaces 35a and 35b and is thus disposed so that the longitudinal direction thereof follows the Y-axis direction. Therefore, the ampoule 20 can be easily disposed at the predetermined position in the reservoir 66. In addition, the ampoule 20 comes into contact with the inclined surfaces 35a and 35b at the predetermined position and is held in a stable state. Therefore, the through-hole 21 can be stably and reliably formed in the ampoule 20.

In addition, when the inclination angle of the inclined surface 35a and the inclination angle of the inclined surface 35b are the same, the center of the ampoule 20 is disposed at the position that overlaps the intersection portion 37 in the plan view. Accordingly, even in a case where the diameter φ of the ampoule 20 is different or varies, the position irradiated with the pulsed laser light 70 can be easily aligned with the center position of the ampoule 20 in the process of forming the through-hole 21. Therefore, as in the second embodiment, a decrease in the manufacturing yield of the gas cell 60 and an increase in the number of manufacturing processes are more effectively suppressed, and thus it is possible to further enhance productivity.

In addition, the cross-sectional shape of the reservoir 66 of the gas cell 60 according to the fourth embodiment is not limited to the shape illustrated in FIG. 10A. The cross-sectional shape of the reservoir 66 may also be, for example, a shape having different inclined surfaces as illustrated in FIG. 10B.

In a gas cell 60A illustrated in FIG. 10B, a reservoir 66A of a cell portion 62A includes the inclined surface 35a and the inclined surface 35b on the bottom portion side, and the lengths thereof (the widths thereof in the X-axis direction) are different from each other. In other words, the position of the intersection portion 37 where the two inclined surfaces 35a and 35b intersect each other is shifted from the center position of the reservoir 66A in the X-axis direction toward the +X direction side. The opening 18 is provided to be shifted from the center position of the reservoir 66A in the X-axis direction toward the −X direction side so as to be positioned above the inclined surface 35b which is longer. Even in this configuration, the same effects as those of the gas cell 60 illustrated in FIG. 10A are obtained.

The above-described embodiments merely represent an aspect of the invention, and arbitrary modifications and applications can be made without departing from the scope of the invention. As modification examples, for example, the following examples are considered.

Modification Example 1

Figure 11A:
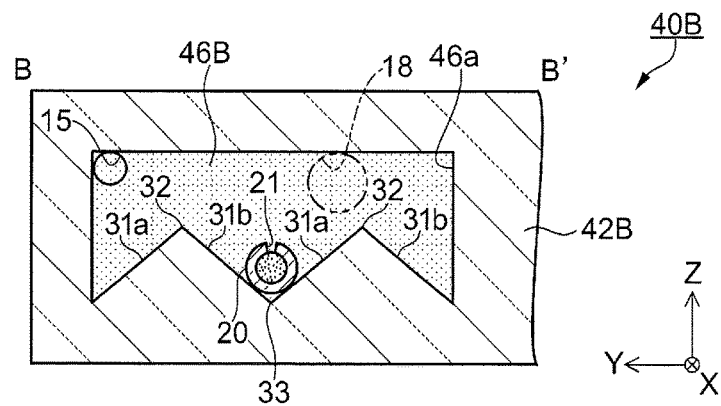
FIG. 11A is a schematic view illustrating the configurations of a gas cell according to Modification Example 1.
Figure 11B:
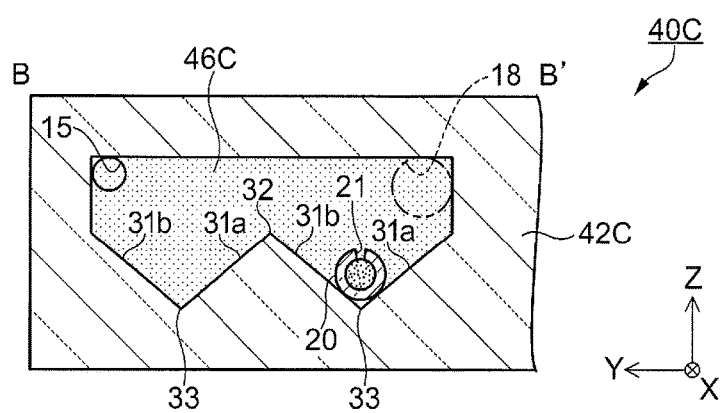
FIG. 11B is a schematic view illustrating the configurations of the gas cell according to Modification Example 1.
Figure 11C:
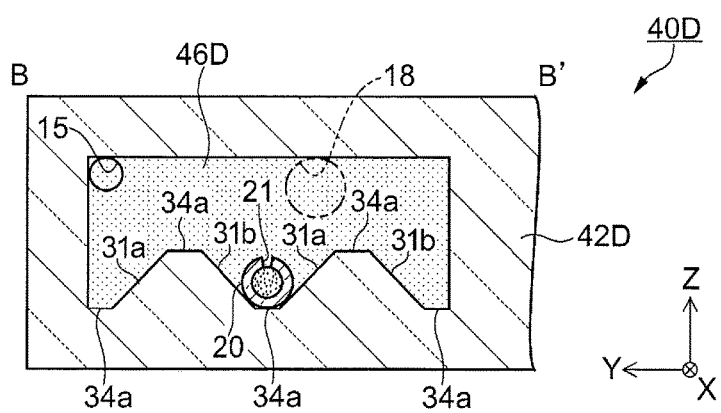
FIG. 11C is a schematic view illustrating the configurations of the gas cell according to Modification Example 1.

The magnetism measuring device of the embodiments has a configuration in which two inclined surfaces are provided on the bottom portion side of the reservoir of the gas cell. However, the invention is not limited to this configuration. A configuration in which three or more inclined surfaces are provided on the bottom portion side of the reservoir of the gas cell may also be employed. FIGS. 11A to 11C are schematic views illustrating the configurations of a gas cell according to Modification Example 1. Even in the configurations illustrated in FIGS. 11A to 11C, the same effects as those of the embodiments are obtained.

As illustrated in FIG. 11A, a reservoir 46B of a gas cell 40B includes two inclined surfaces 31a and two inclined surfaces 31b on the bottom portion side. One pair of the inclined surfaces 31a and 31b form a convex portion having a mountain shape with an intersection portion 32 as the apex in the cross-sectional view, and two pairs of the inclined surfaces 31a and 31b are arranged such that a concave portion having a valley shape with an intersection portion 33 as the valley bottom is formed. In FIG. 11A, the ampoule 20 is disposed at the position of the intersection portion 33. However, the ampoule 20 may also be disposed at a position at which the inclined surface 31b and a side wall 46a come into contact with each other.

As illustrated in FIG. 11B, a reservoir 46C of a gas cell 40C includes two inclined surfaces 31a and two inclined surfaces 31b on the bottom portion side. One pair of the inclined surfaces 31a and 31b form a concave portion having a valley shape with an intersection portion 33 as the valley bottom in the cross-sectional view, and two pairs of the inclined surfaces 31a and 31b are arranged such that a convex portion having a mountain shape with an intersection portion 32 as the apex is formed. The ampoule 20 is disposed at the intersection portion 33.

As illustrated in FIG. 11C, a reservoir 46D of a gas cell 40D includes two inclined surfaces 31a, two inclined surfaces 31b, and five flat surfaces 34a on the bottom portion side. The flat surface 34a is disposed between the inclined surfaces 31a and 31b, which form one pair, the inclined surfaces 31a and 31b and the flat surface 34a constitute a group, two groups are arranged with the flat surface 34a interposed therebetween, and the flat surfaces 34a are disposed on both sides thereof. The ampoule 20 is disposed at a position so as to come into contact with the inclined surfaces 31a and 31b and the flat surface 34a interposed therebetween.

In the embodiments and Modification Example 1, in the configurations in which the ampoule 20 is disposed in the concave portion, the concave portion has a V-shaped cross-sectional shape having two intersecting inclined surfaces and a trapezoidal cross-sectional shape. However, the concave portion may also have a cross-sectional shape other than the V shape or the trapezoidal shape, and for example, may have a U-shaped cross-sectional shape.

Fifth Embodiment
Manufacturing Method of Gas Cell (Example 2 of Manufacturing Method)

Figure 12A:
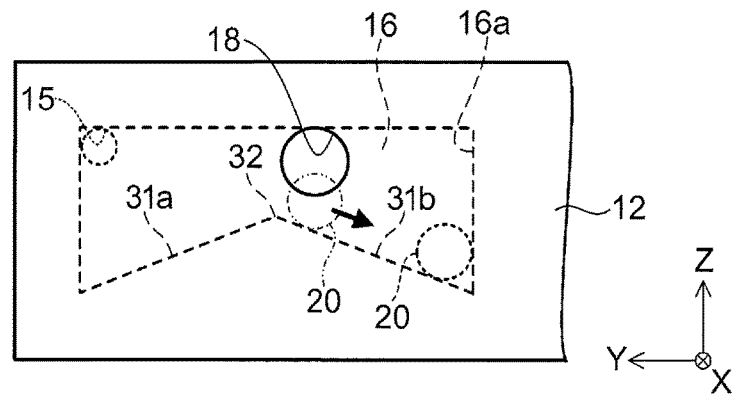
FIG. 12A is a view illustrating a manufacturing method (Example 2) of a gas cell according to a fifth embodiment.
Figure 12B:
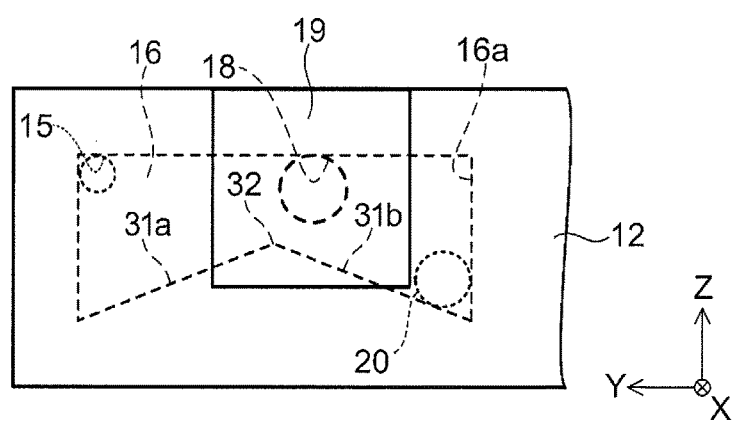
FIG. 12B is a view illustrating the manufacturing method (Example 2) of the gas cell according to the fifth embodiment.
Figure 13A:
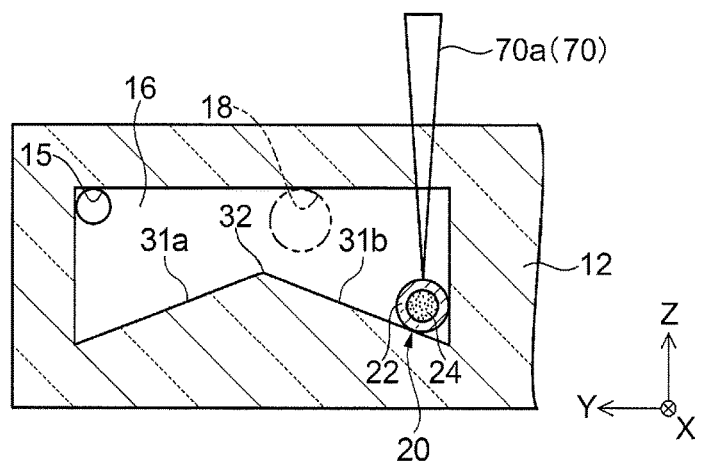
FIG. 13A is a view illustrating the manufacturing method (Example 2) of the gas cell according to the fifth embodiment.
Figure 13B:
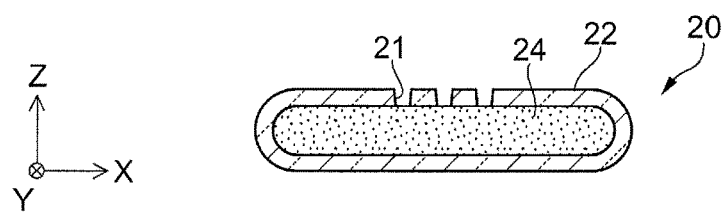
FIG. 13B is a view illustrating the manufacturing method (Example 2) of the gas cell according to the fifth embodiment.
Figure 13C:
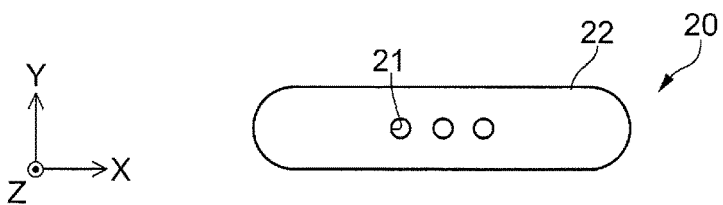
FIG. 13C is a view illustrating the manufacturing method (Example 2) of the gas cell according to the fifth embodiment.
Figure 14A:
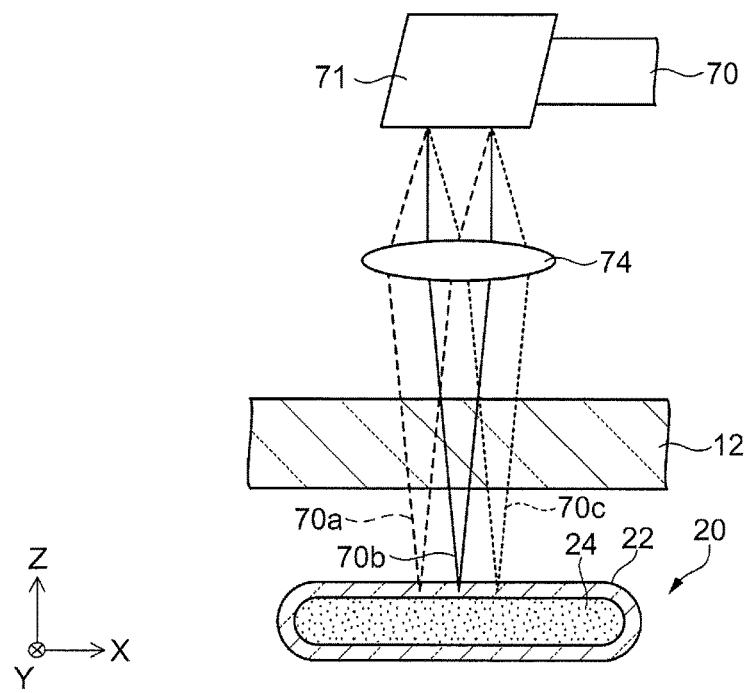
FIG. 14A is a view illustrating the manufacturing method (Example 2) of the gas cell according to the fifth embodiment.
Figure 14B:
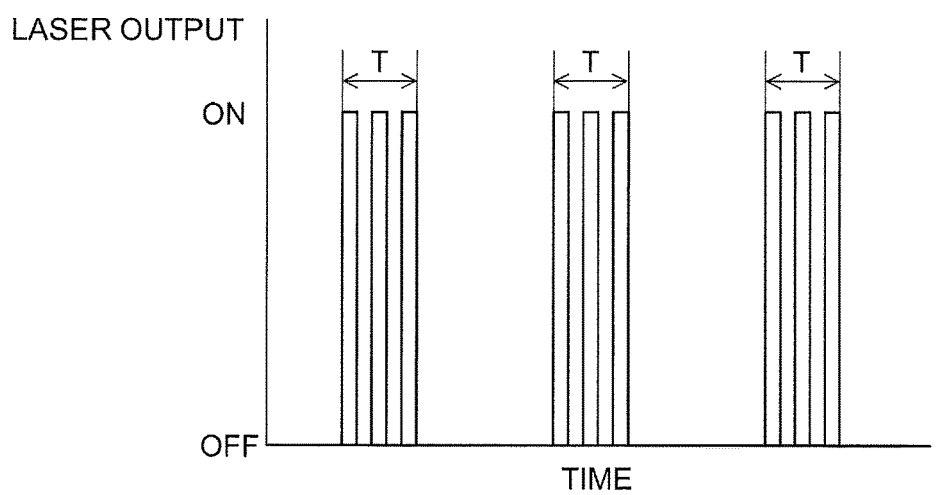
FIG. 14B is a view illustrating the manufacturing method (Example 2) of the gas cell according to the fifth embodiment.

Next, Example 2 of the manufacturing method of the gas cell 10 according to a fifth embodiment will be described with reference to FIGS. 12A to 14B. FIGS. 12A to 14B are views illustrating the manufacturing method (Example 2) of the gas cell according to the fifth embodiment. Specifically, FIGS. 12A and 12B are side views of the gas cell 10 corresponding to FIG. 2C. FIG. 13A is a cross-sectional view of the gas cell 10 corresponding to FIG. 4A, FIG. 13B is a sectional view of the ampoule 20 corresponding to FIG. 3A, and FIG. 13C is a plan view of the ampoule 20 of FIG. 13B when viewed from the +Z direction side. FIGS. 14A and 14B are views illustrating a laser light irradiation method. In addition, the configuration of the magnetism measuring device 100 in which the gas cell 10 is used is the same as that of the first embodiment described above, and thus description thereof will not be repeated. Like elements are denoted by like reference numerals.

First, the cell portion 12 illustrated in FIG. 5A is prepared. Although not illustrated, for example, by cutting a glass plate made of quartz glass, glass plate members corresponding to the wall surfaces constituting the cell portion 12 are prepared. In addition, the glass plate members are assembled, and the glass plate members are joined together by an adhesive or welding, thereby obtaining the cell portion having the main chamber 14 and the reservoir 16 as illustrated in FIG. 5A. In this stage, the opening 18 of the cell portion 12 is open. In addition, the inclined surfaces 31a and 31b (see FIG. 4A) in the reservoir 16 can be formed by processing the glass plate members and forming inclined surfaces, or by obliquely arranging the glass plate members and joining them together.

Subsequently, the ampoule 20 is accommodated in the reservoir 16 of the cell portion 12 (arranging process). As illustrated in FIG. 12A, the ampoule 20 is inserted through the opening 18 provided on the reservoir 16 side of the cell portion 12 and is accommodated in the reservoir 16. Since the opening 18 is at a higher position than the inclined surface 31b, the ampoule 20 inserted through the opening 18 falls on the inclined surface 31b. In addition, since the opening 18 is provided near the intersection portion 32, the drop of the ampoule 20 that occurs when the ampoule 20 is inserted through the opening 18 and falls on the inclined surface 31b is reduced, and thus the risk of carelessly breaking the ampoule 20 due to an impact or the like can be reduced.

In addition, the opening 18 is disposed above the inclined surface 31b with respect to the predetermined position at which the ampoule 20 is disposed. Therefore, the ampoule 20 slips on the inclined surface 31b or rolls on the inclined surface 31b about its longitudinal direction as the rotation axis and thus moves to the bottom portion side indicated by arrow along the inclined surface 31b. In addition, the ampoule 20 stops at the position at which the ampoule 20 comes into contact with the side wall 16a, that is, the predetermined position. At this time, the ampoule 20 is guided by the inclined surface 31b and the side wall 16a and is thus disposed so that the longitudinal direction thereof follows the X-axis direction. Therefore, the ampoule 20 can be easily disposed at the predetermined position in the reservoir 16. The predetermined position at which the inclined surface 31b and the side wall 16a abut each other is a position in which the ampoule 20 is settled.

In addition, in this stage, the ampoule 20 is in a state of being filled with the alkali metal solid 24 in the hollow glass tube 22 and sealed as illustrated in FIG. 3A. The ampoule 20 is formed by filling the inside of the hollow of the tubular glass tube 22 with the alkali metal solid 24 under an atmosphere at a low pressure close to vacuum (ideally, under vacuum) and welding and sealing both end portions of the glass tube 22. The alkali metal such as cesium used as the alkali metal solid 24 has high reactivity and cannot be treated in the air, and is thus accommodated in the cell portion 12 in a state of being sealed in the ampoule 20 under the environment at a low pressure.

Subsequently, as illustrated in FIG. 12B, evacuation of the inside of the cell portion 12 is sufficiently performed, and in a state where an excessively small amount of impurities is present in the internal void, the cell portion 12 (the main chamber 14, the communication hole 15, and the reservoir 16) is sealed (sealing process). For example, under the environment at a low pressure closer to vacuum (ideally, under vacuum), low-melting-point glass frit (not illustrated) is disposed on at least one of the cell portion 12 and the sealing portion 19 in the periphery of the opening 18, and the cell portion 12 and the sealing portion 19 are fixed to each other and sealed, thereby sealing the cell portion 12.

Subsequently, as illustrated in FIG. 13A, the glass tube 22 of the ampoule 20 is irradiated with the pulsed laser light 70 via the cell portion 12 to form a plurality of through-holes 21 (see FIG. 13B) in the glass tube 22 (through-hole forming process). Since laser light has excellent directivity and convergence, the through-hole 21 can be easily formed in the glass tube 22 by emitting the pulsed laser light 70 thereto.

Here, the through-hole 21 needs to be formed in the glass tube 22 of the ampoule 20 without damaging the cell portion 12. In a case where the cell portion 12 is formed of quartz glass and the glass tube 22 is formed of borosilicate glass, for example, the pulsed laser light 70 having a wavelength in the ultraviolet region is used. Light having a wavelength in the ultraviolet region is transmitted through quartz glass but is slightly absorbed by borosilicate glass. Accordingly, the through-hole 21 can be formed by selectively processing the glass tube 22 of the ampoule 20 without damaging the cell portion 12.

FIG. 14A schematically illustrates an irradiation method of the pulsed laser light 70 in the through-hole forming process. As illustrated in FIG. 14A, in the fifth embodiment, the angle of the pulsed laser light 70 which is emitted from a laser oscillator (not illustrated) is controlled by using a galvanometer scanner 71 so as to concentrate the light using a fθ lens 74 and generate a plurality of beams 70a, 70b, and 70c. In addition, as the fθ lens 74, for example, a fθ lens having a focal length 78 mm may be used.

As for the irradiation conditions of the pulsed laser light 70, for example, a pulse width is set to about 30 nm, and pulse energy per one irradiation point (processing point) is set to about 50 μJ/pulse to 200 μJ/pulse. Positions irradiated with the plurality of beams 70a, 70b, and 70c are set on the basis of the predetermined position at which the ampoule 20 is disposed. More specifically, the irradiation points of the beams 70a, 70b, and 70c are set to three points along the X-axis direction, that is, the longitudinal direction of the ampoule 20. In addition, as illustrated in FIG. 14B, scanning and irradiation are performed along the X-axis direction with an irradiation time T of about 100 msec, and an irradiation interval of about 30 μm.

As described above, by generating and emitting the plurality of beams 70a, 70b, and 70c toward the ampoule 20 from the pulsed laser light 70, a plurality of irradiation points (processed points) are processed in parallel in the glass tube 22. In this processing, as illustrated in FIGS. 13B and 13C, a plurality of through-holes 21 are formed in the glass tube 22 so as to be arranged in a line along the X-axis direction, which is the longitudinal direction of the ampoule 20.

Since the plurality of beams 70a, 70b, and 70c are emitted along the longitudinal direction of the ampoule 20, the plurality of through-holes 21 can be easily formed in the ampoule 20. In addition, each of the plurality of irradiation points irradiated with the beams 70a, 70b, and 70c is easily aligned with the center of the width in the longitudinal direction of the ampoule, and thus air-tightness can be more reliably broken in each of the plurality of through-holes 21.

By forming the through-holes 21 in the ampoule 20, as illustrated in FIG. 4A, the air-tightness of the ampoule 20 is broken in the reservoir 16 of the cell portion 12, and thus the alkali metal solid 24 in the ampoule 20 is vaporized, is transitioned into the alkali metal gas 13, and leaks. As illustrated in FIG. 2B, the alkali metal gas 13 that leaks from the reservoir 16 flows into the main chamber 14 of the cell portion 12 through the communication hole 15 and diffuses. As a result, the void of the cell portion 12 is filled with the alkali metal gas 13.

Here, in the through-hole forming process, there may be a case where a process of irradiating a single point with the pulsed laser light 70 and forming a through-hole 21 at a single spot is insufficient for processing performed in a depth direction, and thus the air-tightness of the ampoule 20 is not broken. Particularly, when the ampoule 20 is not held in a stable state in the reservoir 16, due to a slight inclination or impact when the cell portion 12 is treated or an impact due to the irradiation of the pulsed laser light 70, the ampoule 20 may be moved and the position thereof may be shifted. When the position of the ampoule 20 is shifted, the irradiation point of the pulsed laser light 70 with respect to the ampoule 20 is relatively shifted, and thus the processing performed in a depth direction becomes insufficient.

In addition, even when the through-hole 21 is formed, there may be a case where the amount of the alkali metal solid 24 vaporized in the ampoule 20 through the through-hole 21 at the single spot is low and a long time is needed to fill the main chamber 14 with the alkali metal gas 13. Here, when the process of irradiating a single spot with the pulsed laser light 70 is repeated several times in order to reliably form the through-hole 21 or in order to allow the amount of the vaporized alkali metal solid 24 to be larger, there is a problem in that an increase in the number of manufacturing processes is incurred.

In this embodiment, the plurality of through-holes 21 are formed in the ampoule 20 in parallel by irradiating a plurality of spots of the ampoule 20 with the pulsed laser light 70 (beams 70a, 70b, and 70c) in the through-hole forming process. Therefore, compared to the case of irradiating only a single spot with the pulsed laser light 70, the probability of breaking the air-tightness of the ampoule 20 and forming the through-hole 21 is increased, and a range in which the air-tightness is broken (an area from which the alkali metal solid 24 is exposed) is enlarged, and thus the main chamber 14 can be filled with the alkali metal gas 13 within a short time. In addition, since the plurality of through-holes 21 can be formed in the ampoule 20 in parallel in the through-hole forming process, compared to the case of repeating the process of irradiating only a single spot with the pulsed laser light 70, the number of manufacturing processes can be reduced.

In addition, in this embodiment, the predetermined position in which the ampoule 20 is settled is provided on the bottom portion side of the reservoir 16, and the ampoule 20 is disposed at the predetermined position in the reservoir 16 along the X-axis direction and is held at the position in a stable state. Accordingly, the through-hole 21 can be stably and reliably formed in the ampoule 20, and thus a decrease in the manufacturing yield of the gas cell 10 and an increase in the number of manufacturing processes are suppressed, thereby enhancing productivity.

In addition, in the process of forming the through-hole 21 in the ampoule 20, the alkali metal solid 24 may be vaporized and leak from the inside of the ampoule 20. Therefore, without limitation to the formation of the through-hole 21, for example, cracks may be caused to occur in the glass tube 22 to separate the ampoule 20, or the glass tube 22 may be broken. However, in this case, when fragments of the glass tube 22 or the alkali metal solid 24 discharged from the ampoule 20 infiltrate into the main chamber 14 through the communication hole 15, a decrease in the measurement accuracy of the magnetism measuring device 100 is incurred.

In this embodiment, since the communication hole 15 is provided at a position that is distant from the predetermined position at which the ampoule 20 is disposed and at a high position in the reservoir 16, the infiltration of fragments of the glass tube 22 or the alkali metal solid 24 into the main chamber 14 can be prevented. Accordingly, the magnetism measuring device 100 having excellent measurement accuracy can be manufactured and provided.

In addition, the manufacturing method of the magnetism measuring device 100 according to this embodiment includes the manufacturing method of the above-described gas cell 10. In the process of manufacturing the magnetism measuring device 100 according to this embodiment, well-known methods can be used in processes other than the process of manufacturing the gas cell 10, and thus the description thereof will not be repeated.

Sixth Embodiment

Figure 15:
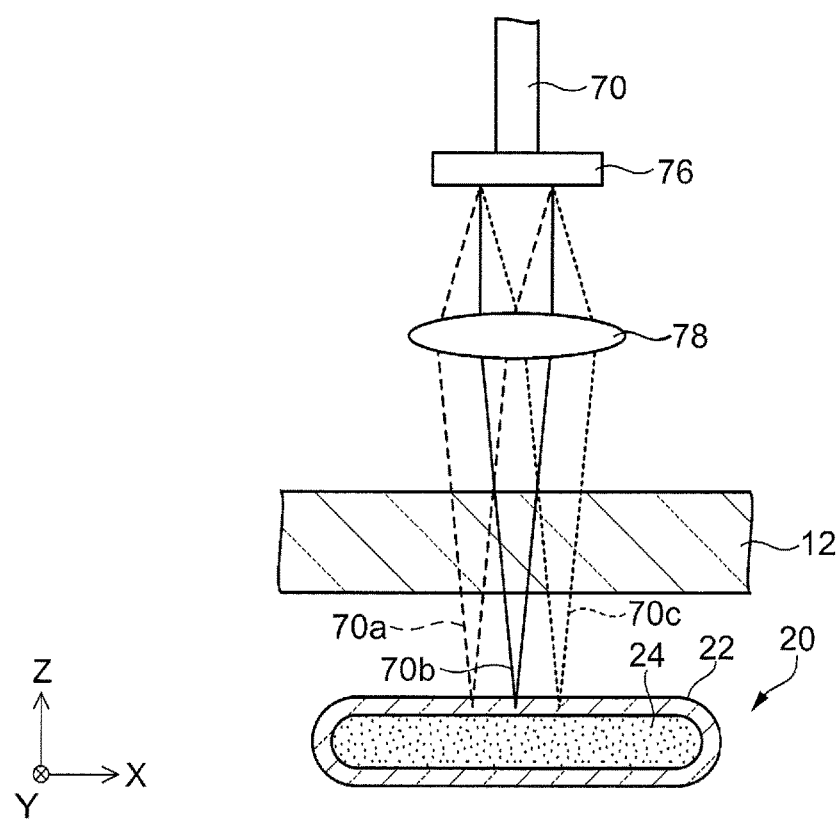
FIG. 15 is a view illustrating a laser light irradiation method according to a sixth embodiment.

A sixth embodiment is different from the fifth embodiment in the method of generating the plurality of beams 70a, 70b, and 70c from the pulsed laser light 70 in the manufacturing method of the gas cell, and the other methods are substantially the same and the configuration of the magnetism measuring device 100 is also the same. The differences of a manufacturing method of a gas cell according to a sixth embodiment from the fifth embodiment will be described with reference to FIG. 15. FIG. 15 is a view illustrating a laser light irradiation method according to the sixth embodiment. In addition, like elements which are similar to those of the fifth embodiment are denoted by like reference numerals, and description thereof will not be repeated.

Manufacturing Method of Gas Cell

FIG. 15 schematically illustrates an irradiation method of the pulsed laser light 70 in the through-hole forming process according to the sixth embodiment. As illustrated in FIG. 15, in the sixth embodiment, the pulsed laser light 70 which is emitted from a laser oscillator (not illustrated) is divided into a plurality of beams 70a, 70b, and 70c by using a diffraction grating 76 and the focuses of the beams 70a, 70b, and 70c are concentrated on the ampoule 20 by using a Fourier-transform lens 78.

As for optical conditions, for example, the wavelength of the pulsed laser light 70 is set to about 355 nm, a focal length is set to about 78 mm, the division number of the diffraction grating is set to 3, and a diffraction grating period is set to about 923 μm. The pulsed laser light 70 is divided into the three beams 70a, 70b, and 70c along the X-axis direction, which is the longitudinal direction of the ampoule 20. Accordingly, the three beams 70a, 70b, and 70c are generated in a straight line along the X-axis direction, and the division interval between the beams becomes 30 μm.

As for the irradiation conditions of the pulsed laser light 70, for example, a pulse width is set to about 30 nm, pulse energy per one irradiation point (processing point) is set to about 50 μJ/pulse to 200 μJ/pulse, and an irradiation time is set to about 300 msec. Accordingly, a plurality of irradiation points (processed points) are processed in parallel in the glass tube 22, and thus the plurality of through-holes 21 are formed in the glass tube 22 so as to be arranged in a line along the X-axis direction, which is the longitudinal direction of the ampoule 20, as in the fifth embodiment (see FIGS. 13B and 13C).

The division interval between the beams 70a, 70b, and 70c is used by changing the period of the diffraction grating 76 and thus can be changed from the above-mentioned division interval. When the cross-section of the diffraction grating 76 uses an analog form such as a sinusoidal waveform, the diffraction efficiency reaches 90% or higher, and thus the loss of the pulsed laser light 70 can be reduced. In addition, when a cell type computer generated holography (CGH) is used in the diffraction grating 76, arbitrary spots can be irradiated with the plurality of beams 70a, 70b, and 70c.

Even in the sixth embodiment, the plurality of through-holes 21 can be formed in the ampoule 20 in parallel in the through-hole forming process. Therefore, compared to the case of repeating the process of irradiating only a single spot with the laser light, the number of manufacturing processes can be reduced. In addition, the through-hole 21 can be stably and reliably formed in the ampoule 20, and thus a decrease in the manufacturing yield of the gas cell 10 and an increase in the number of manufacturing processes are suppressed, thereby enhancing productivity.

The above-described embodiments merely represent an aspect of the invention, and arbitrary modifications and applications can be made without departing from the scope of the invention. As modification examples, for example, the following examples are considered.

Modification Example 2

In the manufacturing method of the magnetism measuring device of the above-described embodiment, the configuration in which the plurality of through-holes 21 are formed in the ampoule 20 to be arranged in a line along the X-axis direction in the through-hole forming process is employed. However, the invention is not limited to this configuration. A configuration in which the plurality of through-holes 21 are formed in different directions or in a state of not being arranged in a line may also be employed. FIGS. 16A to 16E are schematic views illustrating examples of formed through-holes according to Modification Example 2. FIGS. 16A to 16E correspond to the plan view of the ampoule 20 of FIG. 13C viewed from the +Z direction side.

Figure 16A:
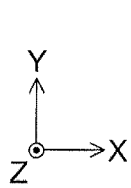
FIG. 16A is a schematic view illustrating an example of formed through-holes according to Modification Example 2.
Figure 16A:
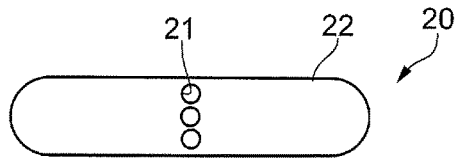
Figure 16B:
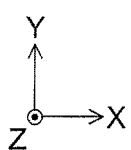
FIG. 16B is a schematic view illustrating an example of formed through-holes according to Modification Example 2.
Figure 16B:
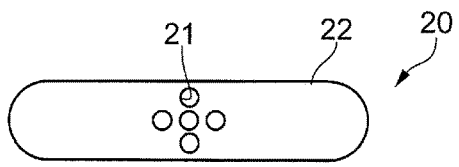
Figure 16C:
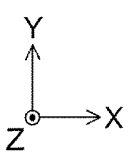
FIG. 16C is a schematic view illustrating an example of formed through-holes according to Modification Example 2.
Figure 16C:
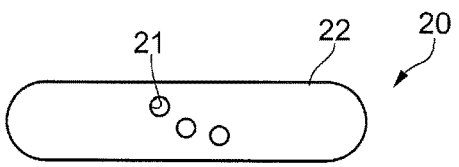
Figure 16D:
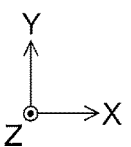
FIG. 16D is a schematic view illustrating an example of formed through-holes according to Modification Example 2.
Figure 16D:
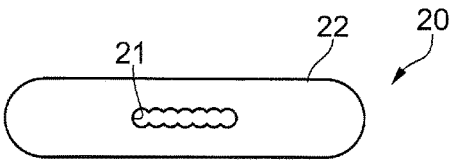
Figure 16E:
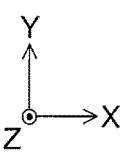
FIG. 16E is a schematic view illustrating an example of formed through-holes according to Modification Example 2.
Figure 16E:
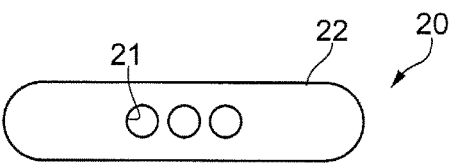

As illustrated in FIG. 16A, the plurality of through-holes 21 may also be formed along the Y-axis direction. As illustrated in FIG. 16B, the plurality of through-holes 21 may also be formed to intersect along the X-axis direction and the Y-axis direction. As illustrated in FIG. 16C, the plurality of through-holes 21 may also be formed to be arranged in an arc shape or a curved shape. In addition, as illustrated in FIG. 16D, the plurality of through-holes 21 may also be formed to be continuous. Furthermore, as illustrated in FIG. 16E, the three through-holes 21 (or some of them) which are formed may be repeatedly irradiated with the pulsed laser light 70 (the beams 70a, 70b, and 70c) by percussion or trepanning to process the through-holes 21 to have large diameters.

Modification Example 3

In the gas cell 10 of the magnetism measuring device 100 of the above-described embodiment, the intersection portion 32 on the bottom portion side of the reservoir 16 has the mountain-shaped convex portion that extends in a ridge shape along the X-axis direction. However, the invention is not limited to this configuration. For example, the bottom portion side of the reservoir may also have a valley-shaped concave portion, and the intersection portion may also have a mountain-shaped convex portion that extends in a ridge shape along the Y-axis direction.

Figure 17A:
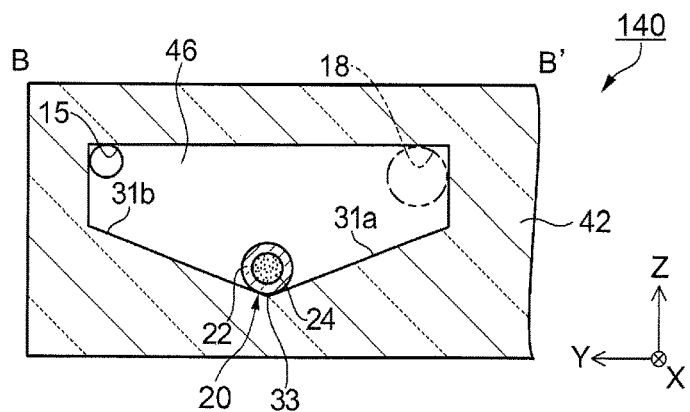
FIG. 17A is a schematic view illustrating a configuration example of a gas cell according to Modification Example 3.
Figure 17B:
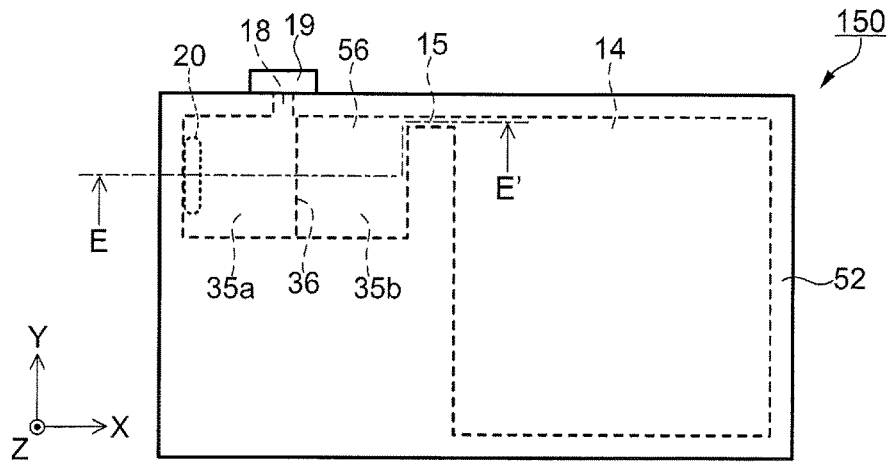
FIG. 17B is a schematic view illustrating a configuration example of the gas cell according to Modification Example 3.
Figure 17C:
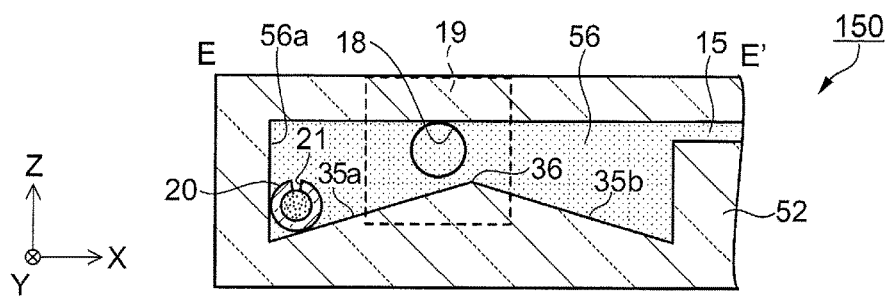
FIG. 17C is a schematic view illustrating a configuration example of the gas cell according to Modification Example 3.

FIGS. 17A, 17B, and 17C are schematic views illustrating configuration examples of a gas cell according to Modification Example 3.

FIG. 17A illustrates a schematic cross-sectional view of a gas cell 140 having a valley-shaped concave portion on the bottom portion side of the reservoir 46. FIG. 17A corresponds to a cross-sectional view taken along line B-B' of FIG. 2A. The reservoir 46 of the cell portion 42 includes the inclined surface 31a and the inclined surface 31b which are inclined toward the opposite sides to each other along the Y-axis direction on the bottom portion side, by the inclined surfaces 31a and 31b, the concave portion which has a valley shape in a cross-section view along the Y-axis direction is formed. The intersection portion 33 at which the inclined surfaces 31a and 31b intersect each other becomes the valley bottom of the concave portion having a valley shape in the cross-sectional view.

The ampoule 20 is positioned at the intersection portion 33 that acts as a position in which the ampoule 20 comes into contact with the inclined surfaces 31a and 31b and is settled, as the predetermined position in the reservoir 46. The ampoule 20 comes into contact with the inclined surfaces 31a and 31b at the predetermined position and is held in a stable state so that the longitudinal direction thereof follows the X-axis direction. When the inclination angle of the inclined surface 31a and the inclination angle of the inclined surface 31b are the same, even in a case where the diameter φ (see FIG. 4A) of the ampoule 20 varies, the center of the ampoule 20 is disposed at the position that overlaps the intersection portion 33 in the plan view. Therefore, even when the diameter φ of the ampoule 20 is different or varies, the positions irradiated with the plurality of beams 70a, 70b, and 70c (see FIG. 14A) can be easily aligned along the longitudinal direction of the ampoule 20 in the through-hole forming process.

FIGS. 17B and 17C illustrate a gas cell 150 having the inclined surfaces 35a and 35b which are inclined along the X-axis direction on the bottom portion side of the reservoir 56. FIG. 17B is a schematic plan view of the gas cell 150, and FIG. 17C is a schematic cross-sectional view taken along line E-E' of FIG. 17B. As illustrated in FIG. 17B, the intersection portion 36 where the inclined surfaces 35a and 35b intersect each other extends in a ridge shape along the Y-axis direction in the reservoir 56 of the cell portion 52. The ampoule 20 is disposed so that the longitudinal direction thereof follows the Y-axis direction.

As illustrated in FIG. 17C, the ampoule 20 is disposed at a position in which the ampoule 20 comes into contact with the inclined surface 35a and the side wall 56a of the reservoir 56 and is settled, as the predetermined position in the reservoir 56 so that the longitudinal direction thereof follows the Y-axis direction. The ampoule 20 comes into contact with the inclined surface 35a and the side wall 56a of the reservoir 56 and is held in a stable state so that the longitudinal direction thereof follows the Y-axis direction. Therefore, the positions irradiated with the plurality of beams 70a, 70b, and 70c (see FIG. 14A) can be easily aligned along the Y-axis direction, which is the longitudinal direction of the ampoule 20, in the through-hole forming process.

Modification Example 4

A device to which the gas cell 10 according to the embodiments can be applied is not limited to the magnetism measuring device 100. The gas cell 10 may also be applied to, for example, an atomic oscillator such as an atomic clock. A small size is required of a gas cell used in an atomic oscillator. However, according to the manufacturing method of the gas cell of the embodiments, the gas cell 10 having a small size can be stably manufactured and thus can be appropriately used in an atomic oscillator having a small size.

The entire disclosure of Japanese Patent Applications No. 2014-232435, filed Nov. 17, 2014 and No. 2014-232436, filed November 17 is expressly incorporated by reference herein.

What is claimed is:

1. A magnetism measuring device for measuring a magnetic field, comprising:
a gas cell which includes:
a cell portion which has a first chamber, a second chamber, a communication hole which allows the first chamber and the second chamber to communicate with each other;
an ampoule disposed in the second chamber;
an opening in the second chamber through which the ampoule is inserted into the second chamber, the opening having a widest dimension that is smaller than a length of the ampoule in its longitudinal direction;
a sealing portion which seals the opening; and
an alkali metal gas which fills the first chamber and the second chamber,
wherein the ampoule is disposed at a predetermined position in the second chamber, and
the opening is provided at a position that is distant from the predetermined position.

2. The magnetism measuring device according to claim 1, further comprising:
an inclined surface provided on a bottom portion side of the second chamber,
wherein the predetermined position is the lowermost position in the inclined surface, and
the opening is provided at a position higher than the inclined surface.

3. The magnetism measuring device according to claim 2, wherein the first chamber and the second chamber are arranged along a first direction,
the inclined surface is inclined along a second direction that intersects the first direction,
the longitudinal direction of the ampoule is disposed to follow the first direction, and
the opening is provided at a position that is distant from the predetermined position in the second direction.

4. The magnetism measuring device according to claim 2, wherein the first chamber and the second chamber are arranged along a first direction,
the inclined surface is inclined along the first direction,
the longitudinal direction of the ampoule is disposed to follow a second direction that intersects the first direction, and
the opening is provided at a position that is distant from the predetermined position in the first direction.

5. The magnetism measuring device according to claim 2, wherein the second chamber includes a convex portion formed by the two inclined surfaces which are inclined toward opposite sides to each other in the same direction and thus intersect each other, and
the opening is disposed between a position at which the inclined surfaces intersect each other and the predetermined position in the direction in which the two inclined surfaces are inclined.

6. The magnetism measuring device according to claim 2, wherein the second chamber includes a concave portion formed by the two inclined surfaces which are inclined toward opposite sides to each other in the same direction and thus intersect each other, and
the opening is disposed at a position that is distant from a position at which the inclined surfaces intersect each other in the direction in which the two inclined surfaces are inclined.

7. The magnetism measuring device according to claim 1, wherein the communication hole is provided at a position that is distant from the predetermined position.

8. The magnetism measuring device according to claim 7, wherein the communication hole is provided at a position higher than the predetermined position.

9. A magnetism measuring device for measuring a magnetic field, comprising:
a gas cell which includes:
a cell portion which has a first chamber, a second chamber, and a communication hole which allows the first chamber and the second chamber to communicate with each other;
an ampoule disposed in the second chamber;
an opening in the second chamber through which the ampoule is inserted into the second chamber, the opening having a widest dimension that is smaller than a length of the ampoule in its longitudinal direction; and
an alkali metal gas which fills the first chamber and the second chamber,
wherein the second chamber is provided with a predetermined position in which the ampoule is settled, and
a plurality of through-holes are formed in the ampoule.

10. A gas cell comprising:
a cell portion which includes a first chamber, a second chamber, a communication hole which allows the first chamber and the second chamber to communicate with each other;
an ampoule disposed in the second chamber;
an opening in the second chamber through which the ampoule is inserted into the second chamber, the opening having a widest dimension that is smaller than a length of the ampoule in its longitudinal direction;
a sealing portion which seals the opening; and
an alkali metal gas which fills the first chamber and the second chamber,
wherein the ampoule is disposed at a predetermined position in the second chamber, and
the opening is provided at a position that is distant from the predetermined position.

11. A manufacturing method of a magnetism measuring device for measuring a magnetic field, the manufacturing method comprising:
inserting an ampoule filled with an alkali metal material into a second chamber of a cell portion through an opening in the second chamber, the cell portion including a first chamber, the second chamber, and a communication hole which allows the first chamber and the second chamber to communicate with each other;
sealing the opening with a sealing portion; and
forming a through-hole in the ampoule by irradiating the ampoule with laser light,
wherein the opening has a widest dimension that is smaller than a length of the ampoule in its longitudinal direction,
after insertion of the ampoule, the ampoule is disposed at a predetermined position in the second chamber, and
the opening is provided at a position that is distant from the predetermined position.

12. A manufacturing method of a magnetism measuring device for measuring a magnetic field, the manufacturing method comprising:
inserting an ampoule filled with an alkali metal material into a second chamber of a gas cell through an opening in the second chamber, the gas cell including a first chamber, the second chamber, and a communication hole which allows the first chamber and the second chamber to communicate with each other;
sealing the first chamber, the second chamber, and the communication hole; and
forming a through-hole in the ampoule by irradiating the ampoule with laser light,
wherein the opening has a widest dimension that is smaller than a length of the ampoule in its longitudinal direction,
the second chamber is provided with a predetermined position in which the ampoule is settled, and
in the forming of the through-hole, a plurality of spots of the ampoule are irradiated with the laser light with respect to the predetermined position.

13. The manufacturing method of a magnetism measuring device according to claim 12,
wherein the predetermined position is provided along a first direction,
the ampoule is disposed at the predetermined position so that its longitudinal direction follows the first direction, and
in the forming of the through-hole, the plurality of spots are irradiated with the laser light along the first direction.

14. The manufacturing method of a magnetism measuring device according to claim 13,
wherein, in the forming of the through-hole, the laser light is emitted along the first direction while performing scanning.

15. The manufacturing method of a magnetism measuring device according to claim 14,
wherein, in the forming of the through-hole, the laser light is allowed to perform scanning by using a galvanometer scanner.

16. The manufacturing method of a magnetism measuring device according to claim 14,
wherein, in the forming of the through-hole, the laser light is emitted in a state of being divided along the first direction.

17. The manufacturing method of a magnetism measuring device according to claim 16,
wherein, in the forming of the through-hole, the laser light is divided by using a diffraction grating.

18. The manufacturing method of a magnetism measuring device according to claim 14,
wherein, in the through-hole forming process, some of the plurality of spots are repeatedly irradiated with the laser light.

19. A manufacturing method of a gas cell, comprising:
inserting an ampoule filled with an alkali metal material into a second chamber of a cell portion through an opening in the second chamber, the cell portion including a first chamber, the second chamber, a communication hole which allows the first chamber and the second chamber to communicate with each other;
sealing the opening with a sealing portion; and
forming a through-hole in the ampoule by irradiating the ampoule with laser light,
wherein the opening has a widest dimension that is smaller than a length of the ampoule in its longitudinal direction,
after insertion of the ampoule, the ampoule is disposed at a predetermined position in the second chamber, and
the opening is provided at a position that is distant from the predetermined position.

* * * * *